(12) United States Patent
Schmit et al.

(10) Patent No.: US 7,262,633 B1
(45) Date of Patent: Aug. 28, 2007

(54) VIA PROGRAMMABLE GATE ARRAY WITH OFFSET BIT LINES

(75) Inventors: Herman Schmit, Palo Alto, CA (US); Steven Teig, Menlo Park, CA (US)

(73) Assignee: Tabula, Inc., Santa Clara, CA (US)

( * ) Notice: Subject to any disclaimer, the term of this patent is extended or adjusted under 35 U.S.C. 154(b) by 91 days.

(21) Appl. No.: 11/271,080

(22) Filed: Nov. 11, 2005

(51) Int. Cl.
*H03K 19/177* (2006.01)
(52) U.S. Cl. .......................................... 326/38; 326/41
(58) Field of Classification Search ............ 326/37–39, 326/41, 47
See application file for complete search history.

(56) References Cited

U.S. PATENT DOCUMENTS 6,529,040 B1 * 3/2003 Carberry et al. .............. 326/40
6,675,309 B1 * 1/2004 Baxter ......................... 713/401
7,193,432 B1 * 3/2007 Schmit et al. ................. 326/38

* cited by examiner

*Primary Examiner*—James H. Cho
(74) *Attorney, Agent, or Firm*—Adeli Law Group

(57) ABSTRACT

Some embodiments provide a via programmable gate array ("VPGA") with several configurable circuits arranged in a configurable circuit arrangement. At least some of the configurable circuits are via programmable ("VP") configured circuits. In some embodiments, the configurable circuit arrangement is a configurable circuit arrangement that includes numerous (e.g., 50, 100, etc.) configurable circuits that are arranged in several rows and columns. This circuit arrangement also includes several bit lines, where at least one the bit line provides a configuration value to at least one configurable circuit. In some embodiments, at least some bit lines transverse along more than one column or row in the circuit arrangement.

14 Claims, 35 Drawing Sheets

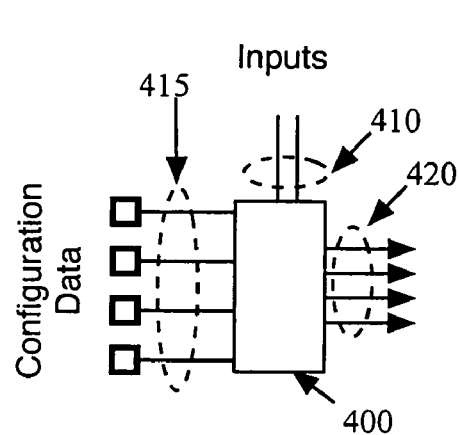
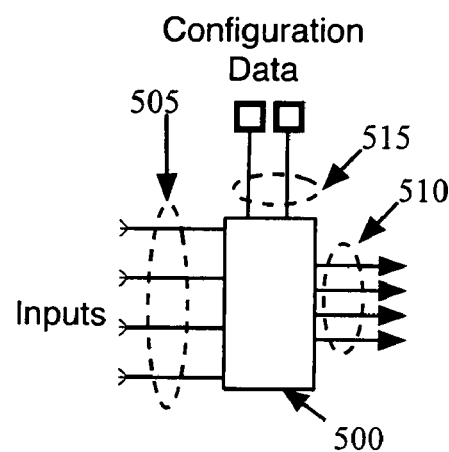
*Figure 4*    *Figure 5*
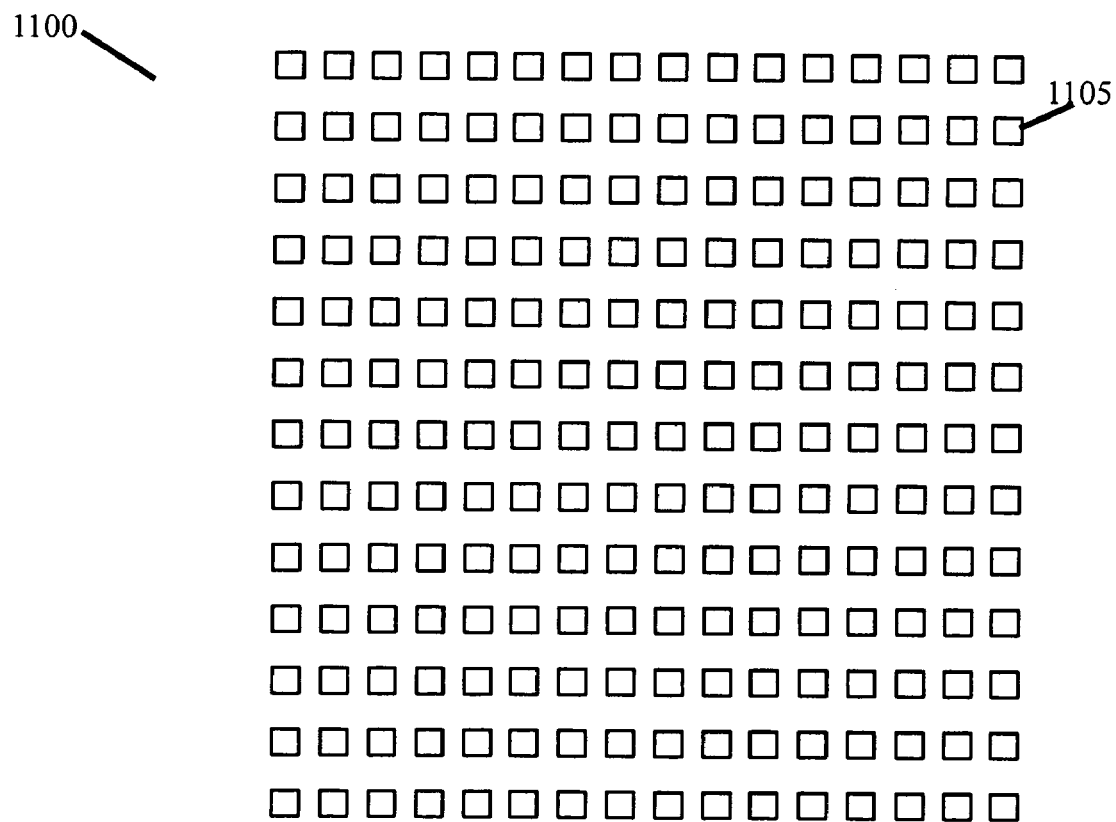
*Figure 11*

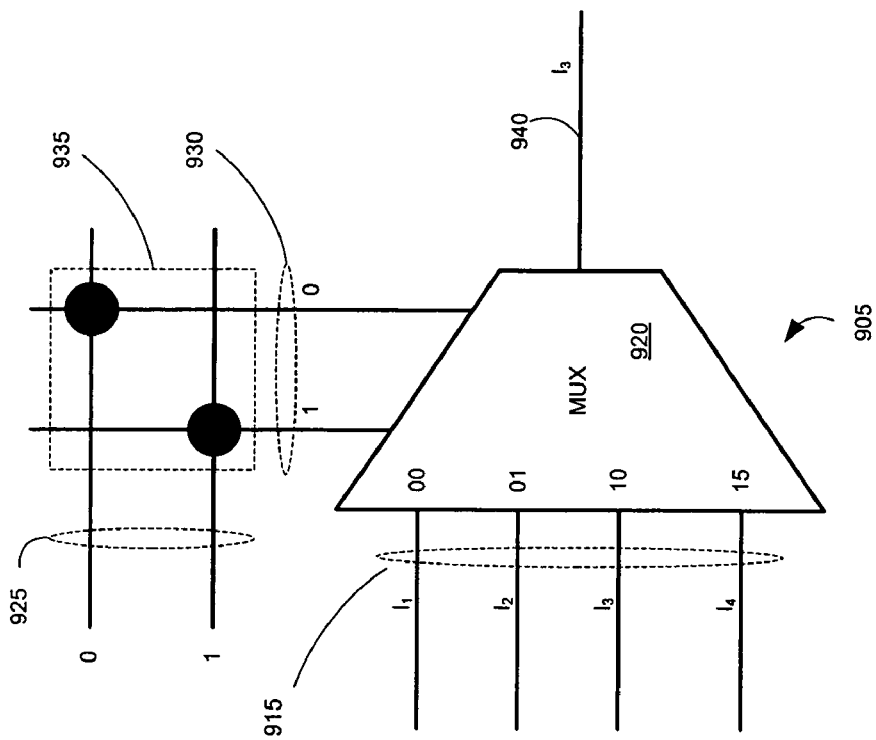
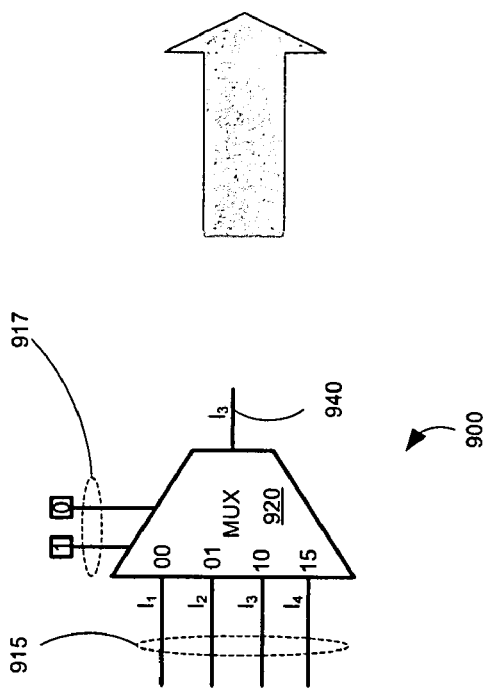
*Figure 9*

VIA PROGRAMMABLE GATE ARRAY WITH OFFSET BIT LINES

CROSS REFERENCE TO RELATED APPLICATION

This Application is related to the following application with the same filing date: U.S. patent application Ser. No. 11/271,161, filed Nov. 11, 2005.

FIELD OF THE INVENTION

The present invention is directed towards via programmable gate array ("VPGA") with offset bit lines.

BACKGROUND OF THE INVENTION

The use of configurable integrated circuits ("IC's") has dramatically increased in recent years. One example of a configurable IC is a field programmable gate array ("FPGA"). An FPGA is a field programmable IC that has an internal array of logic circuits (also called logic blocks) that are connected together through numerous interconnect circuits (also called interconnects). In an FPGA, the internal array of logic and interconnect circuits is typically surrounded by input/output blocks. Like some other configurable IC's, the logic and interconnect circuits of an FPGA are configurable.

FIG. 1 illustrates a portion of a prior art configurable IC 100. As shown in this figure, the IC 100 includes an array of configurable logic circuits 105 and configurable interconnect circuits 110. The IC 100 has two types of interconnect circuits 110a and 110b. Interconnect circuits 110a connect interconnect circuits 110b and logic circuits 105, while interconnect circuits 110b connect interconnect circuits 110a to other interconnect circuits 110a. In some cases, the IC 100 includes hundreds or thousands of logic circuits 105 and interconnect circuits 110.

In some configurable IC architectures, an interconnect circuit 110b can connect to interconnect circuits 110b that are several columns or several rows away from it in the array. FIG. 2 illustrates several such connections in a prior configurable IC architecture 200. In the architecture 200, each logic circuit 105 forms a configurable computational tile 205 in conjunction with two neighboring interconnect circuits 110a and one neighboring interconnect circuit 110b. In each particular tile, each interconnect circuit 110a can receive inputs from the interconnect circuit 110b in the tile and supply a sub-set of the received input signals (e.g., one input signal) to the logic circuit 105 of the tile.

The interconnect circuits 110b in each particular tile serve as switchboxes that connect to other interconnect circuits 110b through intervening interconnect circuits 110a. As shown in FIG. 2, these switchboxes 110b can also connect to other switchboxes 110b that are two or more rows or columns away but in the same column or row. For instance, each switchbox can connect to switchboxes that are one, two, three and six rows above and below it, and to switchboxes that are one, two, three, and six columns to its right and left.

In the architecture of FIG. 2, a particular logic circuit 105 connects to logic circuits that are in the four tiles that are diagonally adjacent to the particular logic circuit's tile, through four connection boxes 110a in these tiles. For instance, FIG. 2 illustrates that the logic circuit 105 in tile 205a connects to the logic circuits 105 in tiles 205b-e through a connection box 110a in these tiles.

The advantage of the connection architecture illustrated in FIG. 2 is that it allows one computation tile to connect to another computational tile that is not a neighboring tile. On the other hand, this architecture requires the use of multiple connections to connect two tiles that are not diagonally adjacent and that are in two different rows and columns. This requirement makes the connection architecture illustrated in FIG. 2 inefficient and expensive as each connection requires the use of transistor switching logic.

Also, the connection architecture illustrated in FIG. 2 employs the same set of long connection schemes for each tile. Hence, as shown in FIG. 3, this architecture can result in a loop between two tiles 305 and 310 in the same column, or two tiles 315 and 320 in the same row. Such cycles are undesirable as they come at the expense of reachability of other tiles. The uniform connection architecture of FIG. 2 is also inefficient as it provides more ways than necessary for reaching one tile from another tile. This redundancy is illustrated in FIG. 3, which illustrates that the tile 325 can connect to tile 330 through two different sets of connections, one that goes through tile 335 and one that goes through tile 340. This redundancy is undesirable as it comes at the expense of reachability of other tiles.

Another example of a configurable IC is a VPGA. Like an FPGA, a VPGA includes configurable circuits. In a VPGA, at least some of the configurable circuits receive their configuration data from bit lines that supply configuration bits (e.g., 0 and 1 values) to various configurable circuits. In some embodiments, such a configurable circuit connects to such configuration bit lines through a set of vias that are defined to "configure" the configurable circuit. Such circuits are referred to below as via programmable ("VP") configurable circuits.

Typically, the design and production of masks for ICs is very expensive. VPGAs are advantageous over other configurable ICs because some of the masks for the VPGA have already been defined. Therefore, only masks for certain layers (e.g., the customizable layers) of the VPGA need to be defined. As such, a VPGA has a much smaller non-recurring expenditures ("NRE") than other configurable ICs.

Like some prior FPGA's, the architecture of current VPGA's use direct connections to connect vertically or horizontally aligned configurable circuits. Current VPGA's also use straight bit lines to provide the configuration bits to the configurable circuits. Such constraints on the architecture of current VPGA's have many of the same drawbacks as in the FPGA context.

There is a need in the art for a configurable IC that has a wiring architecture that increases the interconnectivity between its configurable circuits. Ideally, this wiring architecture is optimized for the interconnectivity between the configurable circuits of the configurable IC. Furthermore, such a wiring architecture can be used for a via programmable gate array ("VPGA").

SUMMARY OF THE INVENTION

Some embodiments of the invention provide a VPGA with a several of configurable circuits arranged in a configurable circuit arrangement. At least some of the configurable circuits are via programmable configured circuits. In some embodiments, the configurable circuit arrangement is a configurable circuit arrangement that includes numerous (e.g., 50, 100, etc.) configurable circuits that are arranged in several rows and columns. This circuit arrangement also includes several direct offset connections, where each particular direct offset connection connects two configurable circuits that are neither in the same column nor in the same row in the circuit arrangement. In some embodiments, at least some direct offset connections connect pairs of circuits that are separated in the circuit arrangement by more than one row and at least one column, or by more than one column and at least one row.

Some embodiments establish a direct connection by (1) a set of wire segments that traverse through a set of the VPGA's wiring layers, and (2) a set of vias when two or more wiring layers are involved. In some embodiments, some of the direct connections have intervening circuits (e.g., buffer circuits), while other direct connections do not have any intervening circuits. Also, in some embodiments, the circuits in the configurable circuit arrangement are all similar (e.g., have the same set of circuit elements and same internal wiring between the circuit elements).

In some embodiments, the VPGA's configurable circuit arrangement has (1) two similar circuits within the interior of the circuit arrangement, and (2) two different connection schemes. The first connection scheme specifies a set of connections between the first circuit and a set of circuits in the circuit arrangement, while the second connection scheme specifies a second set of connections between the second circuit and a set of circuits in the circuit arrangement. The two circuits cannot connect to any circuit on the boundary of the circuit arrangement with any connection that is specified in any connection scheme.

Some embodiments provide a method that defines a set of connections that connect the circuits in a VPGA. The method identifies different sets of connections for connecting a set of the circuits. For each identified set of connections, the method computes a metric score that quantifies a quality of the identified set of connections. The method then selects one of the identified sets of connections to connect the configurable circuits in the circuit arrangement.

In some embodiments, at least some of the configuration bit lines of the VPGA are not straight. In other words, these bit lines traverse along more than one column or traverses along more than one row in the configurable circuit arrangement of the VPGA.

BRIEF DESCRIPTION OF THE DRAWINGS

The novel features of the invention are set forth in the appended claims. However, for purpose of explanation, several embodiments of the invention are set forth in the following figures.

FIG. 4 illustrates a configurable logic circuit that can perform a set of functions FIG. 5 illustrates an example of a configurable interconnect circuit.

FIG. 9 illustrates a VP configured interconnect circuit that includes a VPA.

FIG. 11 illustrates an example of a configurable circuit arrangement.

DETAILED DESCRIPTION OF THE INVENTION

Figure 1:
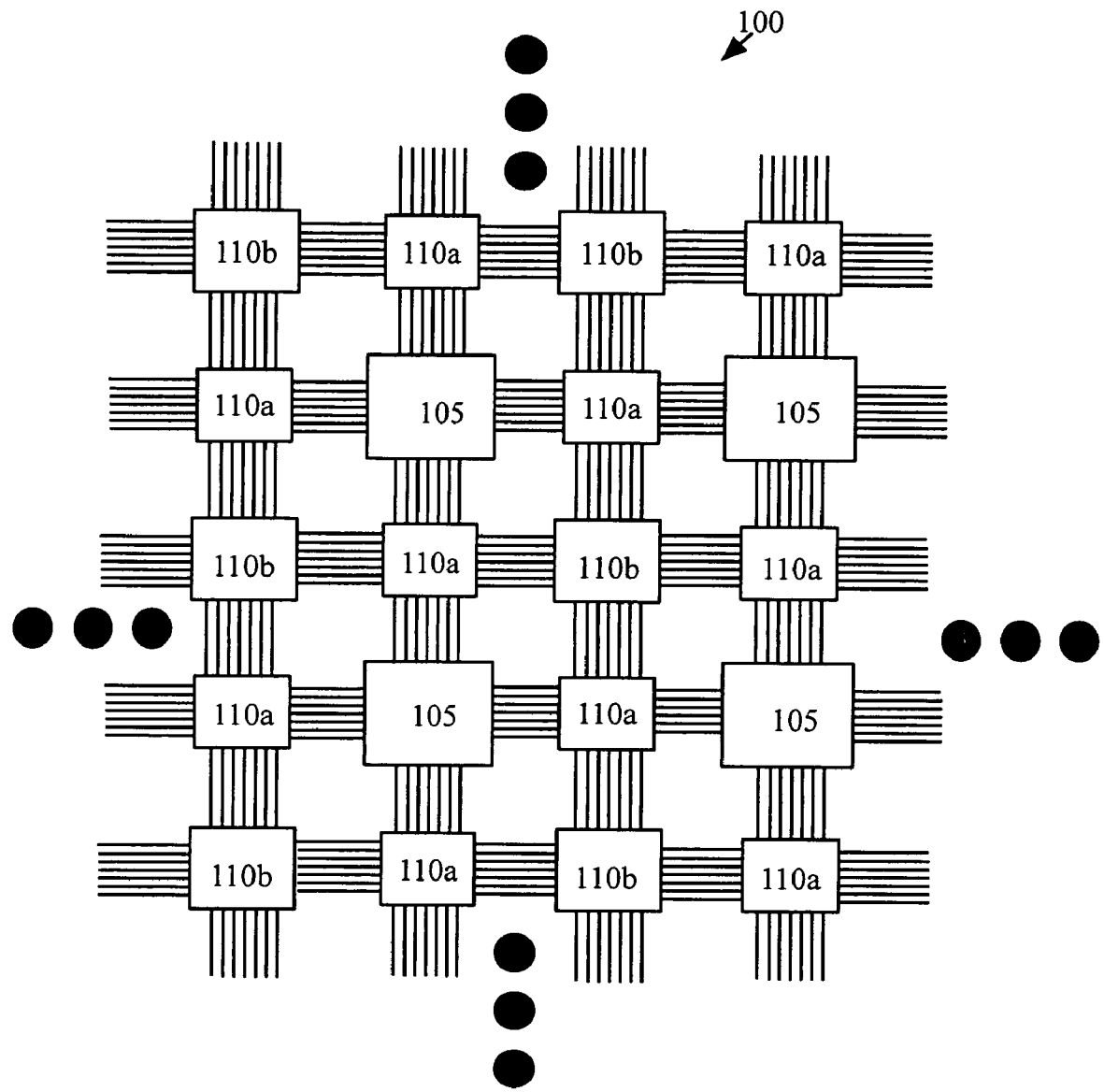
FIG. 1 illustrates a portion of a prior art configurable IC

In the following description, numerous details are set forth for purpose of explanation. However, one of ordinary skill in the art will realize that the invention may be practiced without the use of these specific details. For instance, not all embodiments of the invention need to be practiced with the specific number of bits and/or specific devices (e.g., multiplexers) referred to below. In other instances, well-known structures and devices are shown in block diagram form in order not to obscure the description of the invention with unnecessary detail.

I. Overview

Some embodiments of the invention provide a VPGA with several configurable circuits arranged in a configurable circuit arrangement. At least some of the configurable circuits are via programmable configured circuits. In some embodiments, the configurable circuit arrangement is a configurable circuit arrangement that includes numerous (e.g., 50, 100, etc.) configurable circuits that are arranged in several rows and columns. This circuit arrangement also includes several direct offset connections, where each particular direct offset connection connects two configurable circuits that are neither in the same column nor in the same row in the circuit arrangement. In some embodiments, at least some direct offset connections connect pairs of circuits that are separated in the circuit arrangement by more than one row and at least one column, or by more than one column and at least one row.

Some embodiments establish a direct connection by (1) a set of wire segments that traverse through a set of the VPGA's wiring layers, and (2) a set of vias when two or more wiring layers are involved. In some embodiments, some of the direct connections have intervening circuits (e.g., buffer circuits), while other direct connections do not have any intervening circuits. Also, in some embodiments, the circuits in the configurable circuit arrangement are all similar (e.g., have the same set of circuit elements and same internal wiring between the circuit elements).

In some embodiments, the VPGA's configurable circuit arrangement has (1) two similar circuits within the interior of the circuit arrangement, and (2) two different connection schemes. The first connection scheme specifies a set of connections between the first circuit and a set of circuits in the circuit arrangement, while the second connection scheme specifies a second set of connections between the second circuit and a set of circuits in the arrangement. The two circuits cannot connect to any circuit on the boundary of the circuit arrangement with any connection that is specified in any connection scheme.

Some embodiments provide a method that defines a set of connections that connect the circuits in a VPGA. The method identifies different sets of connections for connecting a set of the circuits. For each identified set of connections, the method computes a metric score that quantifies a quality of the identified set of connections. The method then selects one of the identified sets of connections to connect the configurable circuits in the circuit arrangement.

In some embodiments, at least some of the configuration bit lines of the VPGA are not straight. In other words, these bit lines traverse along more than one column or traverses along more than one row in the configurable circuit arrangement of the VPGA.

II. Terms and Concepts

A. Configurable IC's

A configurable circuit is a circuit that can "configurably" perform a set of operations. Specifically, a configurable circuit receives "configuration data" that specifies the operation that the configurable circuit has to perform in the set of operations that it can perform. In some embodiments, the configuration data is generated outside of the configurable IC. In these embodiments, a set of software tools typically converts a high-level IC design (e.g., a circuit representation or a hardware description language design) into a set of configuration data that can configure the configurable IC (or more accurately, the configurable IC's configurable circuits) to implement the IC design.

Examples of configurable circuits include configurable logic circuits and configurable interconnect circuits. A logic circuit is a circuit that can perform a function on a set of input data that it receives. A configurable logic circuit is a logic circuit that can be configured to perform different functions on its input data set.

FIG. 4 illustrates a configurable logic circuit 405 that can perform a set of functions. Specifically, this figure illustrates a Look Up Table ("LUT") that has a set of input terminals 410, a set of configuration terminals 415 and an output terminal 420. In some embodiments, the data for the set of configuration terminals 415 are stored in a set of storage cells (e.g., SRAM cells), which are typically located near the logic circuits. From the set of functions that a configurable logic circuit can perform, the configuration data set specifies a particular function that the configurable logic circuit has to perform on the input data set. The logic circuit is said to be configurable as the configuration data set "configures" the logic circuit to perform a particular function. In some embodiments, the configuration data specifies bit values (e.g., 0, 1) to the configurable logic circuit.

A configurable interconnect circuit is a circuit that can configurably connect an input set to an output set in a variety of manners. FIG. 5 illustrates an example of a configurable interconnect circuit 500. As shown in this figure, the interconnect circuit 500 is a multiplexer ("MUX"). This interconnect circuit 500 connects a set of input terminals 505 to a set of output terminals 510, based on a set of configuration data that the interconnect circuit 500 receives from a set of configuration terminals 515. In other words, the configuration terminals 515 carry configuration data from a set of storage cells (e.g., SRAM cells) that specify how the interconnect circuit 500 should connect the input terminal set 505 to the output terminal set 510. The interconnect circuit 500 is said to be configurable as the configuration data set "configures" the interconnect circuit 500 to use a particular connection scheme that connects the input terminal set 505 to the output terminal set 510 in a desired manner.

B. VPGA's

1. Overview

Like any configurable IC, a VPGA includes configurable circuits. The VPGA of some embodiments includes both configurable logic and interconnect circuits, while the VPGA of other embodiments includes only one type of configurable circuits (e.g., configurable logic circuits or configurable interconnect circuits).

In a VPGA, at least some of the configurable circuits receive their configuration data from bit lines that supply configuration bits (e.g., 0 and 1 values) to various configurable circuits. In some embodiments, such a configurable circuit connects to such configuration bit lines through a set of vias that are defined to "configure" the configurable circuit. Such circuits are referred to below as via programmable ("VP") configurable circuits, as further described below.

Configurable IC's that have VP configured circuits are referred to as VPGA's because the vias that connect VP configuration circuits to the configuration bit lines are often part of via programmable arrays (VPA's) in the non-configured design of the IC. For each particular VP configurable circuit, a programmable via array specifies (in the non-configured IC design) several potential sites for vias that can connect the input of the particular VP configurable circuit to the configuration bit lines. A VPGA is configured by specifying vias at the potential via sites in order to supply desired configuration data sets to the VP configured circuits. Users can specify such vias by using tools provided by the VPGA vendors.

A VPGA might also contain configurable circuits that receive configuration data from storage elements (e.g., SRAM cells) that are placed relatively close to the configurable circuits. VPGA's are at times referred to by other names, such as structured ASIC's, etc. Examples of via configurations in conjunction with bit lines will now be described below.

2. VP Configurable Logic and Interconnect Circuits

As mentioned above, a via configuration for a VPGA can be defined by specifying one or more vias locations from a set of potential via locations. In some embodiments, these specified vias define the configuration data (e.g., bit values from bit lines) that a circuit (e.g., logic circuit, interconnect circuit) receives to perform certain operations (e.g., function, connection).

Figure 6:
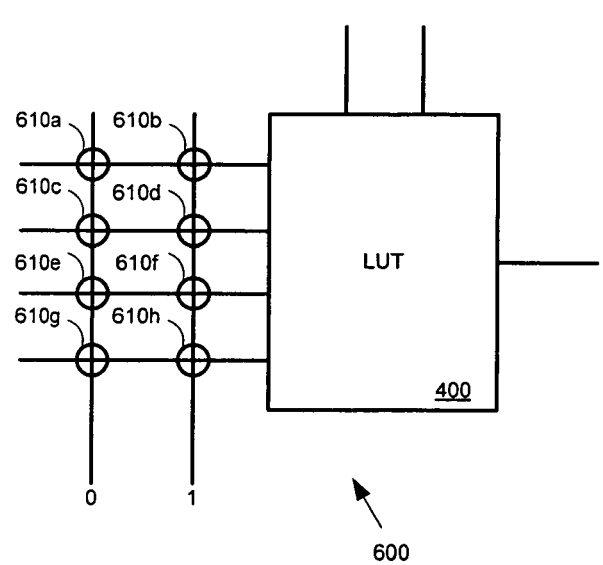
FIG. 6 illustrates a VP configurable logic circuit design.
Figure 7:
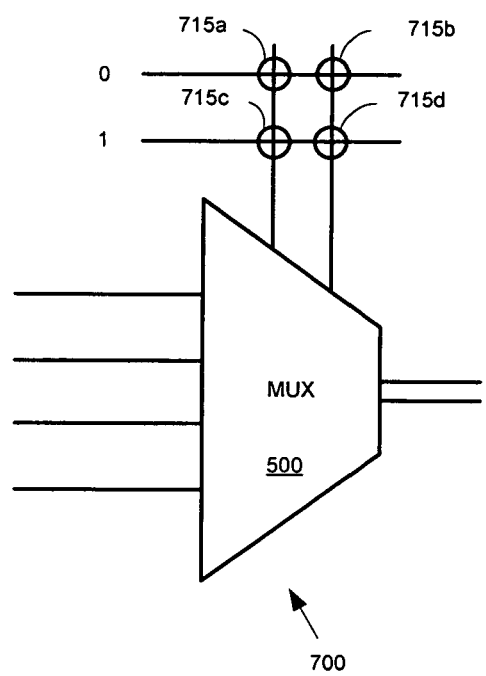
FIG. 7 illustrates a VP configurable interconnect circuit design

FIGS. 6 and 7 conceptually illustrate two different VP configurable circuit designs. Specifically, these figures illustrate a VP configurable logic circuit design 600 and a configurable interconnect circuit design 700. The logic circuit design 600 includes a LUT 400 and an associated VPA 610. The VPA 610 further includes eight potential via locations 610a-610h. The VPA 610 includes a potential via 610 at each location where a line in the first set of bit lines overlaps a line in the second set of configuration lines. When the values of the configuration signal set are known, certain vias in the arrangement of potential vias can be set (i.e., hardwired) based on these values to complete the definition of the VP configurable logic circuit design 600.

Figure 8:
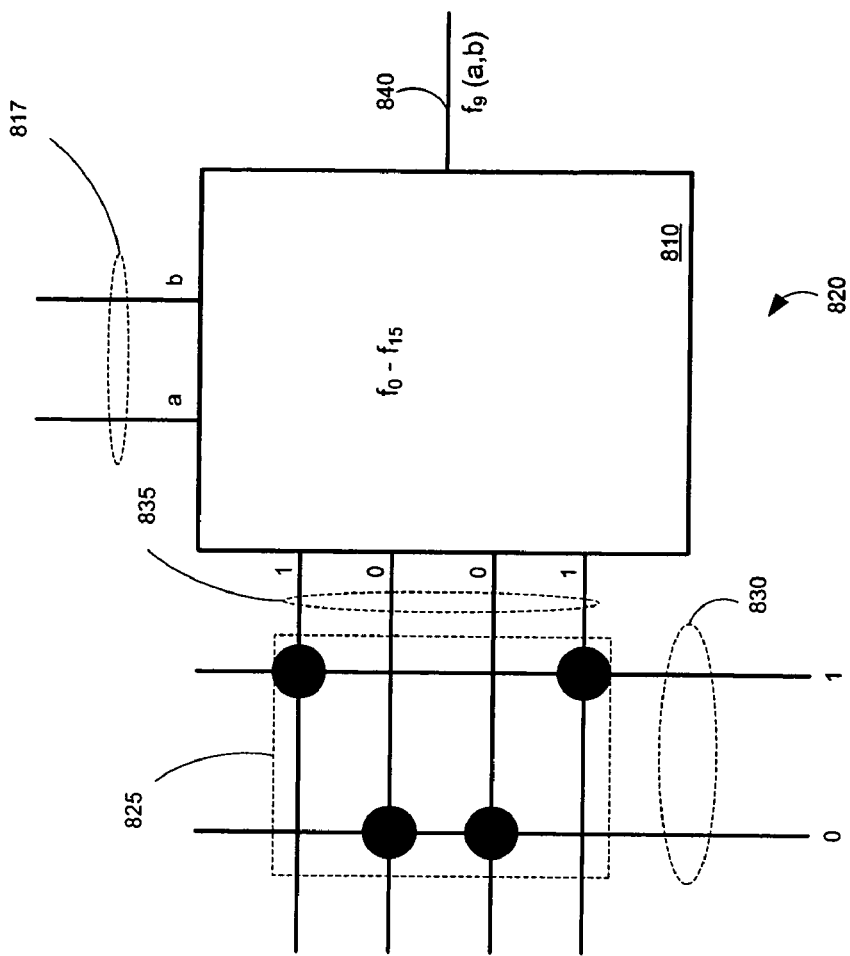
FIG. 8 illustrates a VP configured logic interconnect circuit that includes a VPA.

In some embodiments, the VPA 610 subsumes the same operations as the storage cells and configuration terminals 415 of FIG. 4. FIG. 8 provides an example to illustrate this. Specifically, FIG. 8 illustrates a VP configured logic circuit 820 of some embodiments of the invention. The VP configured logic circuit 820 includes a LUT 810 and a VPA 825. To further elaborate on a VP configured logic circuit, FIG. 8 further illustrates a VP configured logic circuit 820 and an equivalent non-VP configured logic circuit 800. Specifically, this figure illustrates via locations of the VPA 825 that are set in a particular manner, such that the VP configured logic circuit 820 receives the same bit values as the non-VP configured logic circuit 800.

The VPA 825 is formed by two sets of lines that overlap. Typically, the two sets of lines appear on two different wiring layers of the IC, although these lines might appear on three or more layers in some embodiments. The first set is a set of configuration bit lines 830, while the second set is a set of configuration terminals 835 that input into the LUT 810. As shown in FIG. 8, each line in the first set of bit lines 830 overlaps each line in the second set of lines 835 at a 90° angle. In other embodiments, each line in the first set of bit lines 830 might not overlap every line in the second set of lines 835, and/or each line may overlap at a different angle.

In FIG. 8, the vias that are defined in the VPA structure 825 are illustrated as black dots. These defined vias allow the VP configured logic circuit 820 to perform the same functions on the input set 817 and output the results as an output set 840 in the same manner as the configurable logic circuit 800, for the configuration signal values 1, 0, 0, and 1. Specifically, in the VP configured logic circuit 820, (1) the first configuration signal (from signal set 835) is connected by a first via to the first set of bit lines 830, such that the first configuration signal to the LUT 810 is 1, (2) the second configuration signal (from signal set 835) is connected by a second via to the first set of bit lines 830, such that the second configuration signal to the LUT 810 is 0, (3) the third configuration signal (from signal set 835) is connected by a third via to the first set of bit lines 830, such that the third configuration signal to the LUT 810 is 0, and (4) the fourth configuration signal (from the signal set 835) is connected by a fourth via to the first set of lines 830, such that the fourth configuration signal to the LUT 810 is 1.

As shown in this figure, when the LUT 810 of the VP configured logic circuit 820 receives configuration data values of 1, 0, 0 and 1 from the set of configuration signals 835, the LUT 810 performs the ninth function from a set of fifteen functions on the input values 817 (i.e., a, b). The results of performing the function on the input values 817 is the output signal 840.

In addition to VP configured logic circuits, some embodiments also provide VP configured interconnect circuits. As previously mentioned, FIG. 7 illustrates a VP configurable interconnect circuit design. The interconnect circuit design 700 of FIG. 7 includes a MUX 500 and an associated VPA 715. The VPA 715 includes four potential via locations 715a-715d. The VPA 715 includes a potential via 715 at each location where a line in the first set of bit lines overlaps a line in the second set of configuration lines. When the values of the configuration signal set are known, certain vias in the arrangement of potential vias can be set (i.e., hardwired) based on these values to complete the definition of the VP configurable interconnect circuit design 700.

In some embodiments, the VPA 715 subsumes the same operations as the storage cells and configuration terminals 515 of FIG. 5. FIG. 9 provides an example to illustrate this. Specifically, FIG. 9 illustrates an example of a VP configured interconnect circuit 905 of some embodiments of the invention. The VP configured interconnect circuit 905 includes a MUX 920 and a VPA 935. To further elaborate on a VP configured logic circuit, FIG. 9 further illustrates a VP configured interconnect circuit 905 and an equivalent non-VP configured interconnect circuit 900. Specifically, this figure illustrates via locations of the VPA 935 that are set in a particular manner, such that the VP configured interconnect circuit 905 receives the same bit values as the non-VP configured interconnect circuit 900.

The VPA structure 935 is formed by two sets of lines 925 and 930 that overlap. Typically, the two sets of lines 925 and 930 appear on two different wiring layers of the IC. Although these two sets of lines 925 and 930 might appear on three or more layers in some embodiments. In the VPA 935, the first set 925 is a set of bit lines (which provide bit values), while the second set 930 is a set of lines that carry the configuration data to the MUX 920. As shown in FIG. 9, each line in the first set of bit lines 925 in the VPA 935 overlaps each line in the second set of configuration lines 930 at a 90° angle. However, as mentioned above, in other embodiments, each line in the first set might not overlap every line in the second set, and/or each line may overlap at a different angle.

In FIG. 9, the vias that are defined in the VPA 935 are illustrated as black dots. These defined vias allow the VP configured interconnect circuit 905 to connect its input, configuration and output sets 915, 930 and 940 in the same manner as the configurable interconnect circuit 900, for the configuration signal values 1 and 0. Specifically, in the VP configured interconnect circuit 905, (1) the first input signal (from signal set 930) is connected by a first via to the second set of bit lines 925, such that the first input signal to the MUX 920 is 1, and (2) the second input signal (from signal set 930) is connected by a second via to the second set line of bit lines 925, such that the second input signal to the MUX 905 is 0. As shown in this figure, when the MUX 920 of the VP configured interconnect circuit 905 receives configuration data values of 1 and 0 from the set of configuration signals 930, the output signal 940 from the MUX 920 is $I_3$.

In the above description, the VPA subsumes the operations of the storage cells and configuration inputs terminals used in conjunctions with a LUT and/or MUX. However, one skilled in the art will realize that the VPA can be used in conjunctions with other types of circuits. Furthermore, different VPAs may use different via arrangement dimensions (e.g., 2×3, 2×1).

3. Customizable Mask Layers of a Via Programmable Gate Array

VPGA vendors provide the masks for manufacturing all the pre-defined layers (e.g., all the metal and vias layers) of the VPGA, except for one or more customizable layers (e.g., the metal and vias layers) that are necessary for defining the vias in the VPA's of the VPGA. The user then simply generates the masks for the customizable layers that are necessary to specify the vias for connecting the bit lines to the VP configured circuits, once the user has used the configuration tools to determine the location of the vias that result in the desired configuration of the VPGA.

For some vendors, the customizable layers might be the via layers for the vias that establish the electrical connections between the configuration bit lines and the configuration terminals of the VP configured circuits. In other words, these vendors would provide the masks for all metal layers, including the layers between which the customizable vias are defined.

For other vendors, the customizable layers might not only include the via layers (for defining the vias that establish the electrical connections between the configuration bit lines and the configuration terminals of the VP configured circuits), but also include the metal layers between which the customizable vias are defined. Even under this approach, some VPGA vendors might provide the pre-specified wiring design on some or all of the customizable metal layers. For instance, some of these VPGA vendors might only require the tools to modify the pre-specified wiring design on some or all of the customizable metal layers by placing via pads on these layers at the location of the vias.

Figure 10A:
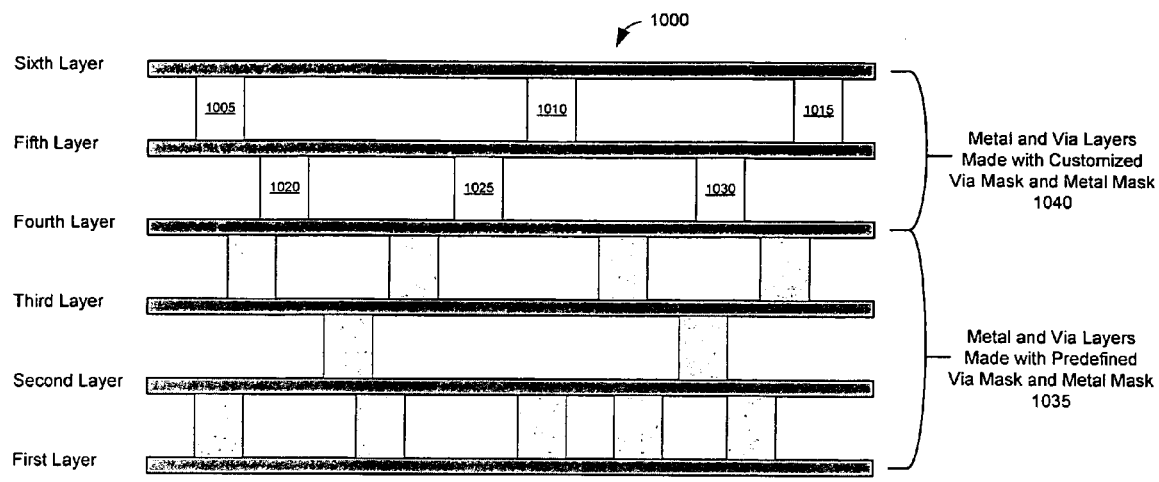
FIG. 10A illustrates a side view of a VPGA.
Figure 10B:
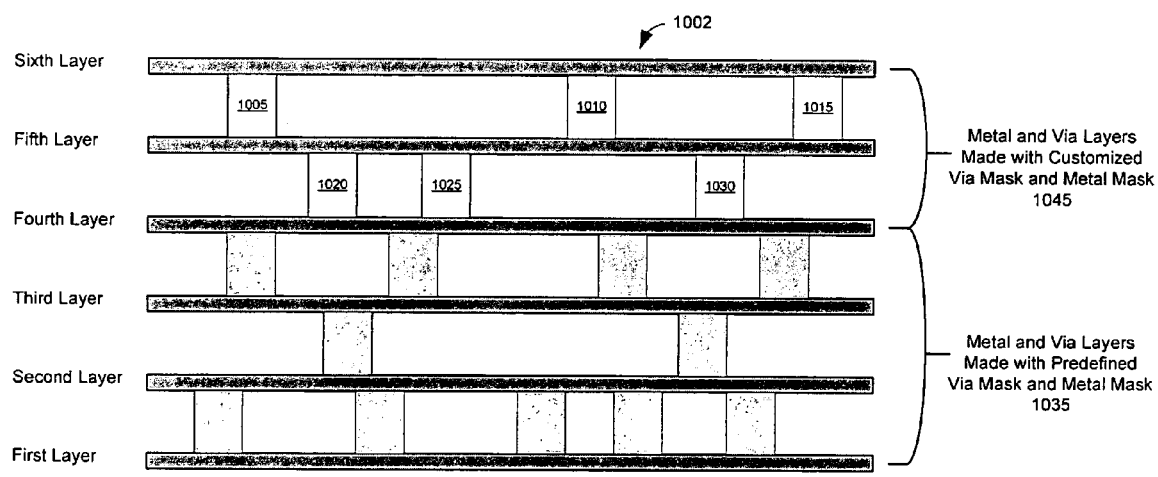
FIG. 10B illustrates a side view of another VPGA that shares a common platform with the VPGA of FIG. 10A.

FIGS. 10A and 10B illustrate side views of two different VPGAs that share a common platform (e.g., have the same set of pre-defined metal and vias layers), but are configured to implement two different user designs. These two VPGAs 1000 and 1002 have identical pre-defined bottom metal and vias layers, but different top customized layers. Specifically, layers 1035 of VPGAs 1000 and 1002 are pre-defined layers. In some embodiments, pre-defined masks can be used to produce the wiring on these layers and the vias between these layers. As further shown in FIGS. 10A and 10B, layers 1040 and 1045 of VPGAs 1000 and 1002 are customized layers for each particular VPGA. In some embodiments, customized masks are used to produce at least the vias between these customized layers, and for some vendors the wiring and/or via pads on these customized layers.

To highlight the differences between the customizable layers 1035 to 1045 of the VPGAs 1000 and 1002, FIGS. 10A and 10B illustrate a different set of vias in these layers in the different VPGA's. Specifically, the location of vias 1005-1010 and 1020-1025 in the VPGA 1002 is different relative to the location of vias 1005-1010 and 1020-1025 in the VPGA 1000 of FIG. 10A. The different locations of the vias conceptually illustrates different connections between the configuration bit lines and the VP-configurable circuit terminals in the VPGAs 1000 and 1002. VPGAs 1000 and 1002 have different connections as they are configured to implement different user designs.

C. Circuit Arrangement

A circuit arrangement is an arrangement with several circuit elements that are arranged in several rows and columns. One example of a circuit arrangement is a configurable circuit arrangement, which is an arrangement where some or all the circuit elements are configurable circuits (e.g., configurable logic and/or interconnect circuits). In a VPGA, some or all of the configurable circuits in a circuit arrangement are VP configured circuits (e.g., VP configured logic circuits and VP configured interconnect circuits, such as those illustrated in FIGS. 8 and 9).

FIG. 11 illustrates an example of a configurable circuit arrangement 1100 that includes 208 configurable circuits 1105 that are arranged in 13 rows and 16 columns. Each configurable circuit in a configurable circuit arrangement is a configurable circuit that includes one or more configurable sub-circuits.

Figure 12:
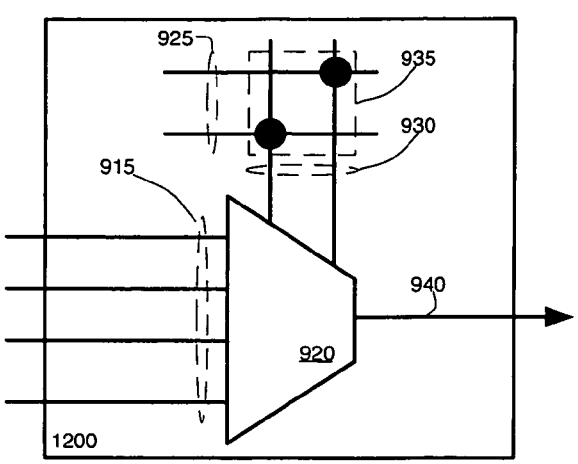
FIGS. 12-15 illustrate several examples of configurable circuits in a configurable circuit arrangement.
Figure 13:
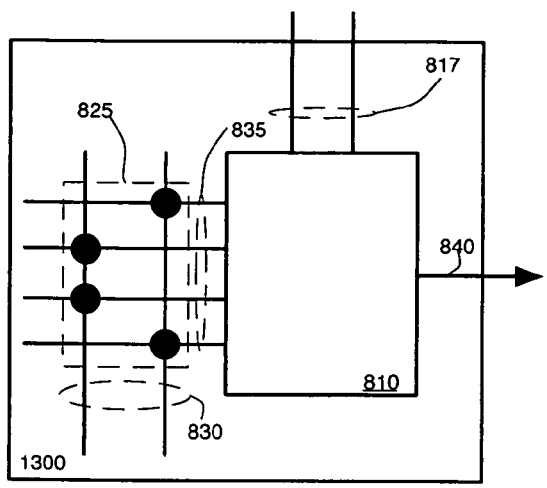

FIGS. 12-15 illustrate several examples of configurable circuits in an circuit arrangement. Specifically, FIG. 12 illustrates a configurable circuit 1200 that is a VP configured interconnect circuit 905. Such an interconnect circuit can be any interconnect circuit such as a multiplexer, a switchbox, a connection box, a switching or routing matrix, a full- or partial-cross bar, etc. Alternatively, as shown in FIG. 13, a configurable circuit 1300 can be a simple VP configured logic circuit 820. Such logic circuits can be any logic circuits, such as a look-up table (LUT), universal logic module (ULM), sub-ULM, multiplexer, PAL/PLA, etc.

Figure 14:
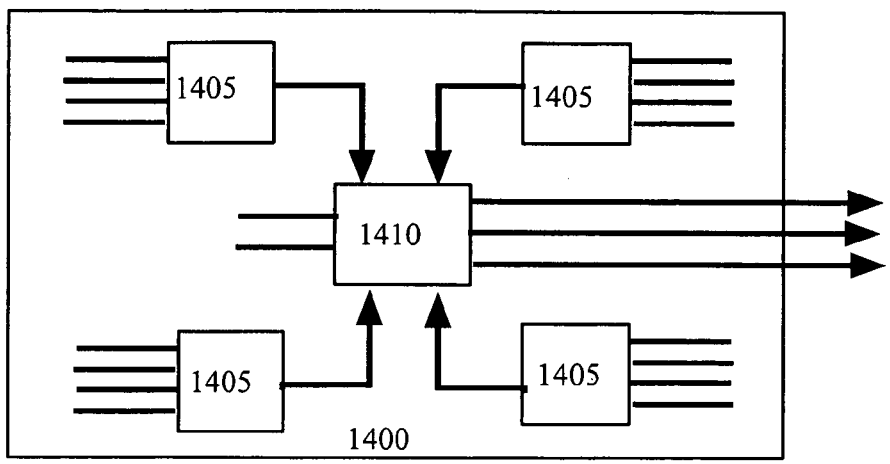

FIG. 14 illustrates yet another configurable circuit. This circuit is a complex logic circuit 1400. This logic circuit is formed by multiple logic circuits (e.g., multiple LUT's) 1405 and an interconnect circuit 1410, where one or more of these circuits is a VP configured circuit. One of ordinary skill will realize that the illustration of the logic circuit 1400 is a simplification that does not show other circuit elements (e.g., fast-carry logic, etc.) that might be used in complex logic circuits. This illustration is provided only to convey the principle that more complex logic circuits are often formed by combining simpler logic circuits and interconnect circuits.

Figure 15:
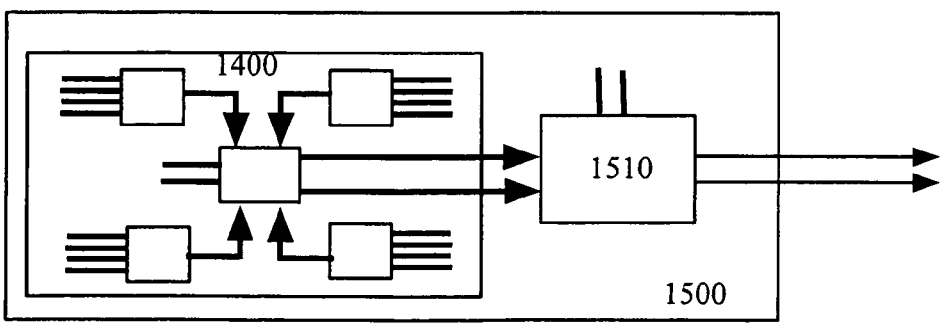

FIG. 15 illustrates still another configurable circuit. This circuit 1500 is formed by a combination of a complex logic circuit (in this example, the complex logic circuit 1400) and a complex interconnect circuit 1510 (e.g., a switchbox or connection box). Some or all of these circuits are VP configured circuits.

In some embodiments, some or all configurable circuits in the circuit arrangement have the same or similar circuit structure. For instance, in some embodiments, some or all the circuits have the exact same circuit elements (e.g., have the same set of logic gates and blocks and/or same interconnect circuits), where one or more of these identical elements are configurable elements. One such example would be a set of circuits in the circuit arrangement that are each formed by a particular set of logic and interconnect circuits. Having circuits with the same circuit elements simplifies the process for designing and fabricating the IC, as it allows the same circuit designs and mask patterns to be repetitively used to design and fabricate the IC.

In some embodiments, the similar configurable circuits not only have the same circuit elements but also have the same exact internal wiring between their circuit elements.

For instance, in some embodiments, a particular set of logic and interconnect circuits that are wired in a particular manner forms each circuit in a set of circuits in the circuit arrangement. Having such circuits further simplifies the design and fabrication processes as it further simplifies the design and mask making processes.

In some embodiments, each configurable circuit in a configurable circuit arrangement is a simple or complex configurable logic circuit. In some embodiments, each configurable circuit in a configurable circuit arrangement is a configurable interconnect circuit. In such a circuit arrangement, a configurable circuit (i.e., a configurable interconnect circuit) can connect to one or more logic circuits. In turn, such logic circuits in some embodiments might be arranged in terms of another configurable logic-circuit arrangement that is interspersed among the configurable interconnect-circuit arrangement.

Also, some embodiments use a circuit arrangement that includes numerous configurable and non-configurable circuits that are placed in multiple rows and columns. In addition, within the above described circuit arrangements and/or configurable circuit arrangements, some embodiments disperse other circuits (e.g., memory blocks, processors, macro blocks, IP blocks, SERDES controllers, clock management units, etc.).

Some embodiments might organize the configurable circuits in a circuit arrangement that does not have all the circuits organized in a circuit arrangement with several aligned rows and columns. Accordingly, instead of referring to configurable circuit arrangements, the discussion below refers to configurable circuit arrangements. Some circuit arrangements may have configurable circuits arranged in one or more circuit arrangements, while other circuits arrangements may not have the configurable circuits arranged in a circuit arrangement.

Several figures below illustrate several direct connections between circuits in a configurable circuit arrangement. A direct connection between two circuits in a configurable circuit arrangement is an electrical connection between the two circuits that is achieved by (1) a set of wire segments that traverse through a set of the wiring layers of the IC, and (2) a set of vias when two or more wiring layers are involved.

In some embodiments, a direct connection between two circuits in a configurable circuit arrangement might also include a set of buffer circuits. In other words, two circuits in a configurable circuit arrangement are connected in some embodiments by a set of wire segments that possibly traverse through a set of buffer circuits and a set of vias. Buffer circuits are not interconnect circuits or configurable logic circuits. In some embodiments, buffer circuits are part of some or all connections. Buffer circuits might be used to achieve one or more objectives (e.g., maintain the signal strength, reduce noise, alter signal delay, etc.) along the wire segments that establish the direct connections. Inverting buffer circuits may also allow an IC design to reconfigure logic circuits less frequently and/or use fewer types of logic circuits. In some embodiments, buffer circuits are formed by one or more inverters (e.g., two or more inverters that are connected in series).

Figure 16:
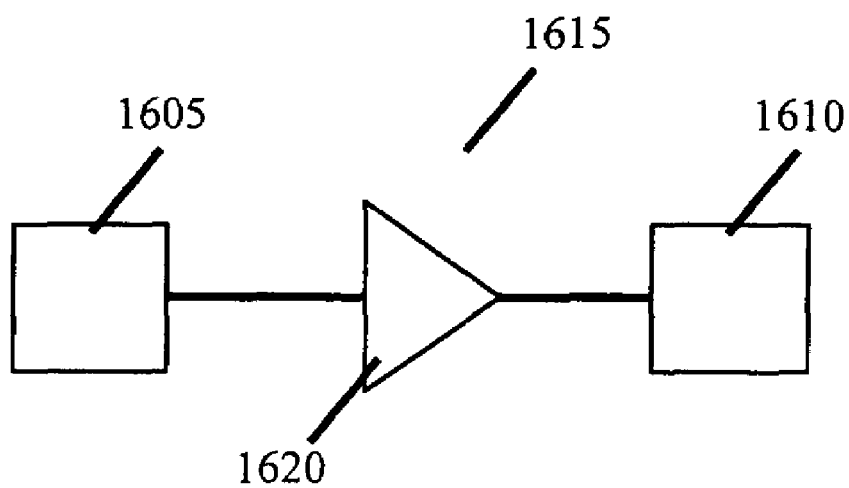
FIGS. 16 and 17 illustrate examples of two direct connections with intervening buffer circuits.
Figure 17:
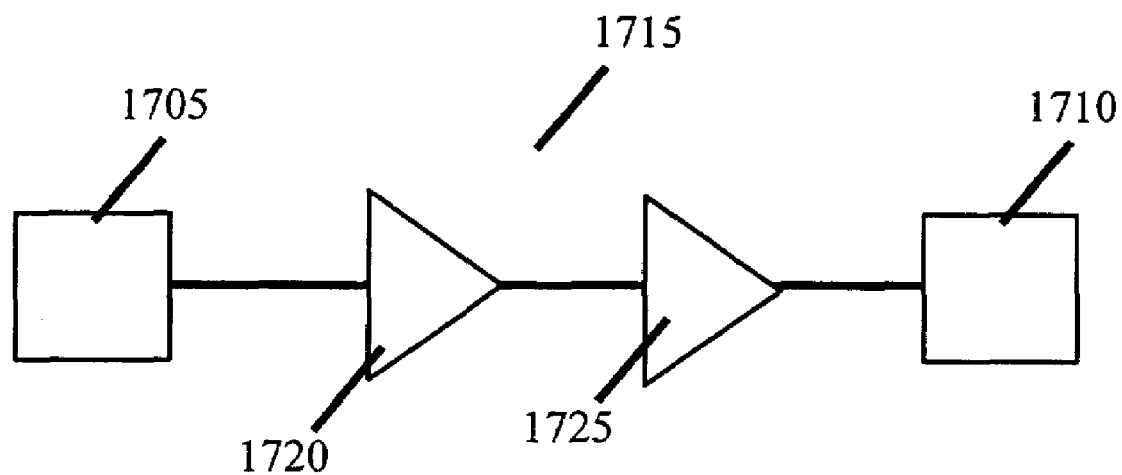

FIGS. 16 and 17 illustrate two connections, each between two circuits in a configurable circuit arrangement. Each of these connections has one or more intervening buffer circuits. Specifically, FIG. 16 illustrates an example of a direct connection 1615 between two circuits 1605 and 1610. As shown in this figure, this direct connection has an intervening buffer circuit 1620. In some embodiments, the buffer circuit 1620 is a inverter. Accordingly, in these embodiments, the direct connection 1615 inverts a signal supplied by one of the circuits 1605 or 1610 to the other circuit.

FIG. 17 illustrates an example of a direction connection 1715 between two circuits 1705 and 1710. As shown in this figure, this direct connection 1715 has two intervening buffer circuits 1720 and 1725. In some embodiments, the buffer circuits 1720 and 1725 are inverters. Hence, in these embodiments, the direct connection 1715 does not invert a signal supplied by one of the circuits 1705 or 1710 to the other circuit.

Alternatively, the intermediate buffer circuits between the logic and/or interconnect circuits can be viewed as a part of the devices illustrated in these figures. For instance, the inverters that can be placed between the circuits 1905 and 1910 can be viewed as being part of these circuits.

Several figures below "topologically" illustrate several direct connections between circuits in a configurable circuit arrangement. A topological illustration is an illustration that is only meant to show a direct connection between two circuits without specifying a particular geometric layout for the wire segments that establish the direct connection or a particular position of the two circuits.

III. Direct Connections Between Offset Circuits in a VPGA'S Circuit Arrangement

Some embodiments provide VPGA's with "long-offset" direct connections between two circuits in the circuit arrangement. A "long-offset" connection is a direct connection between two circuits in the circuit arrangement that are offset by more than one row and at least one column, or more than one column and at least one row. Some or all of the circuits in the circuit arrangement are VP configured circuits or include one or more VP configured circuit. As mentioned above, a direct connection might include one or more buffer circuits that are connected to the wire segments of the direct connection. In some embodiments, such buffer circuits are more likely to be used for longer connections than for the shorter connections, as signal strength is a more pressing issue for longer connections.

Figure 18:
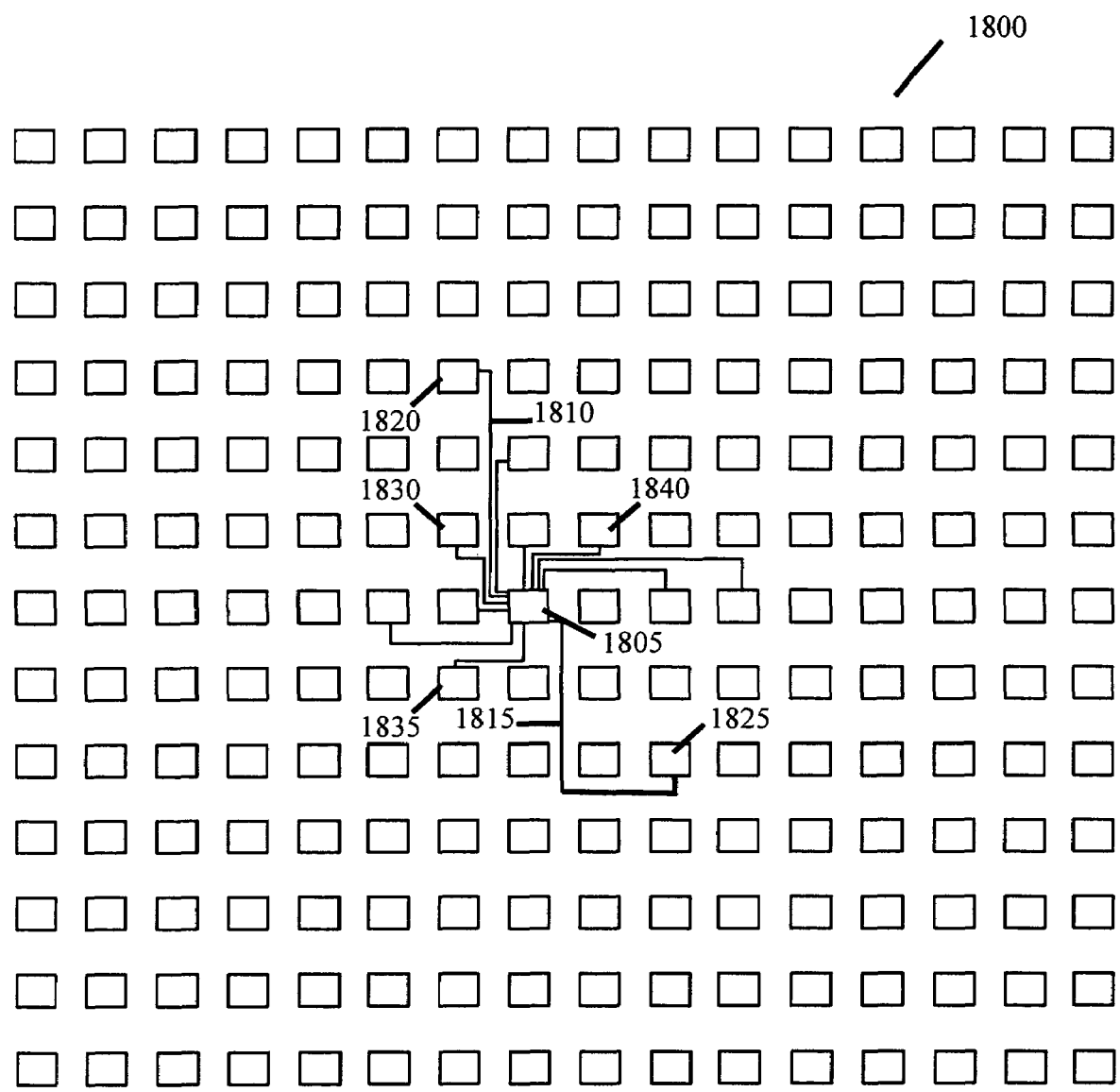
FIG. 18 illustrates an example of two long-offset direct connections.

FIG. 18 illustrates an example of a VPGA with two long-offset direct connections. This figure illustrates the VPGA's configurable circuit arrangement 1800. This circuit arrangement that has numerous configurable circuits (such as circuits 1805, 1820, 1840, etc.) that are arranged in numerous rows and columns. In some embodiments, this circuit arrangement has numerous (hundreds, thousands, millions, etc.) of configurable circuits that are arranged in numerous (e.g., tens, hundreds, thousands, etc. of) rows and columns. This circuit arrangement is a part of a configurable IC that has multiple wiring layers. Some or all of the circuits in the circuit arrangement are VP configured circuits or include one or more VP configured circuit.

FIG. 18 provides a topological illustration of several offset connections between a configurable circuit 1805 and several other circuits in the circuit arrangement 1800. As shown in this figure, the configurable circuit 1805 has direct connections with several circuits that are horizontally/vertically aligned with it in the circuit arrangement. In addition, the configurable circuit 1805 has direct connections with neighboring circuits 1830-1840 that are not horizontally/vertically aligned with circuit 1805. As shown in FIG. 18, circuits 1830-1840 are one row and one column away from the circuit 1805.

This configurable circuit 1805 also has two long-offset direct connections 1810 and 1815. The first direct connection 1810 connects circuit 1805 to circuit 1820, which is above circuit 1805 by three rows and is to the left of the circuit 1805 by one column. The second direct connection 1815 connects circuit 1805 to circuit 1825, which is below circuit 1805 by two rows and is to the right of the circuit 1805 by two columns.

Table 1 below identifies the direct connections of circuit 1805. This table identifies a direct connection between circuit 1805 and one of its neighboring circuits in terms of two coordinates. These two coordinates are a delta-column coordinate and a delta-row coordinate, which specify the column and row offset between the particular circuit and the connected neighboring circuit.

TABLE 1

Direct Connections of Circuit 1805

| Delta-Column | Delta-Row |
|---|---|
| 2 | 0 |
| 3 | 0 |
| 1 | 1 |
| 0 | 1 |
| 0 | 2 |
| −1 | 1 |
| −1 | 3 |
| −1 | 0 |
| −2 | 0 |
| −1 | −1 |
| 2 | −2 |

Figure 19A:
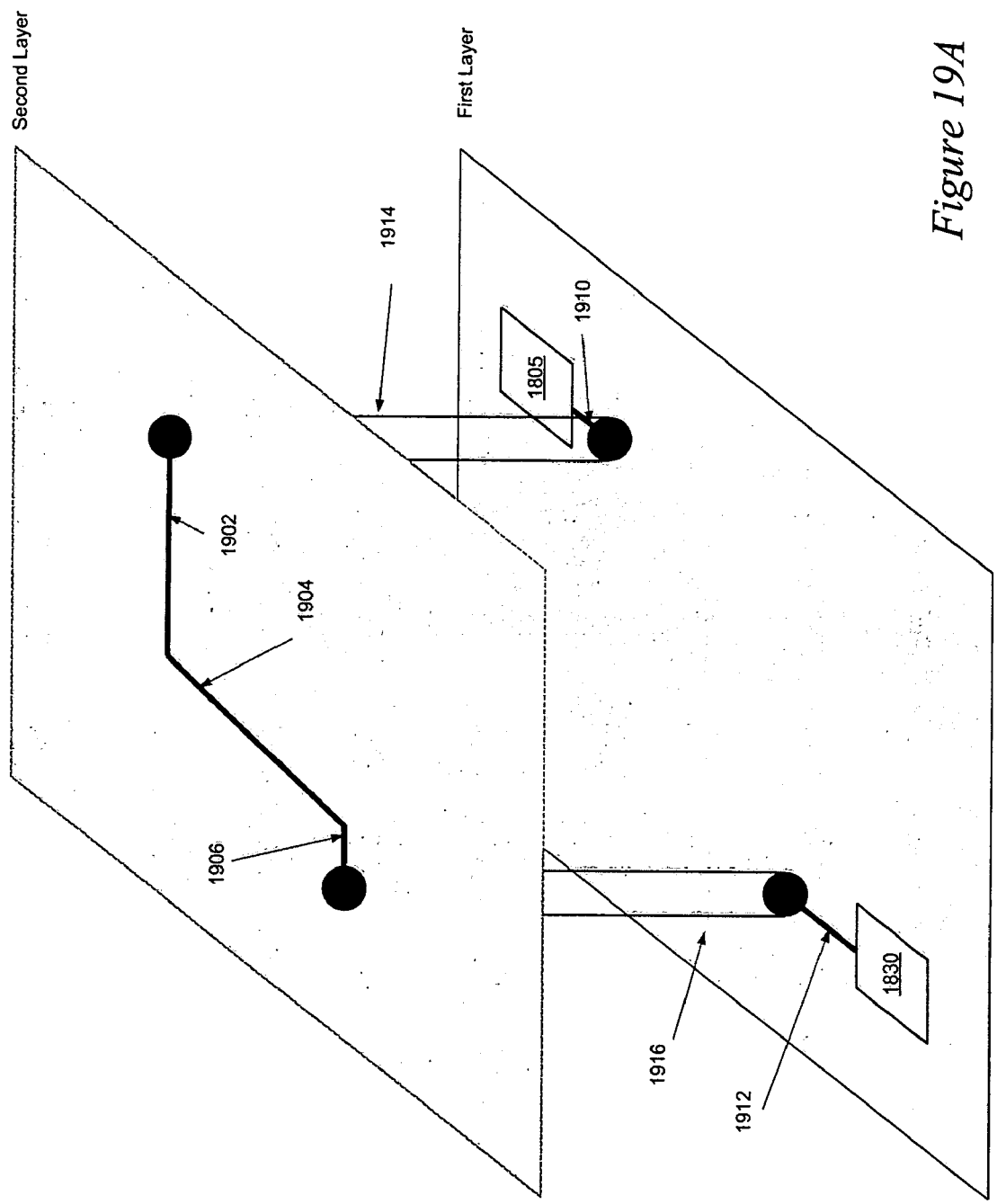
FIGS. 19A-19C illustrate examples of different geometric realizations for some of the direct connections topologically illustrated in FIG. 16.

As mentioned above, the illustrations of the direct connections in FIG. 18 are only topological illustrations. Each of these direct connections can be achieved by a variety of geometric realizations. In some instances, the set of wire segments that establish a direct connection are all on the same layer. For example, as shown in FIG. 19A, four wire segments 1902, 1904, 1906, and 1908 can establish the direct connection between circuits 1805 and 1830. These four segments might be on a layer (e.g., the second wiring layer) that is different from the layer (e.g., the first wiring layer) that has the input/output terminals 1910 and 1912 of circuits 1805 and 1830. Hence, in these cases, the direct connection between circuits 1805 and 1830 also require a set of vias 1914 and 1916 to connect the wire segments 1902 and 1908 to the terminals 1910 and 1912.

Figure 19B:
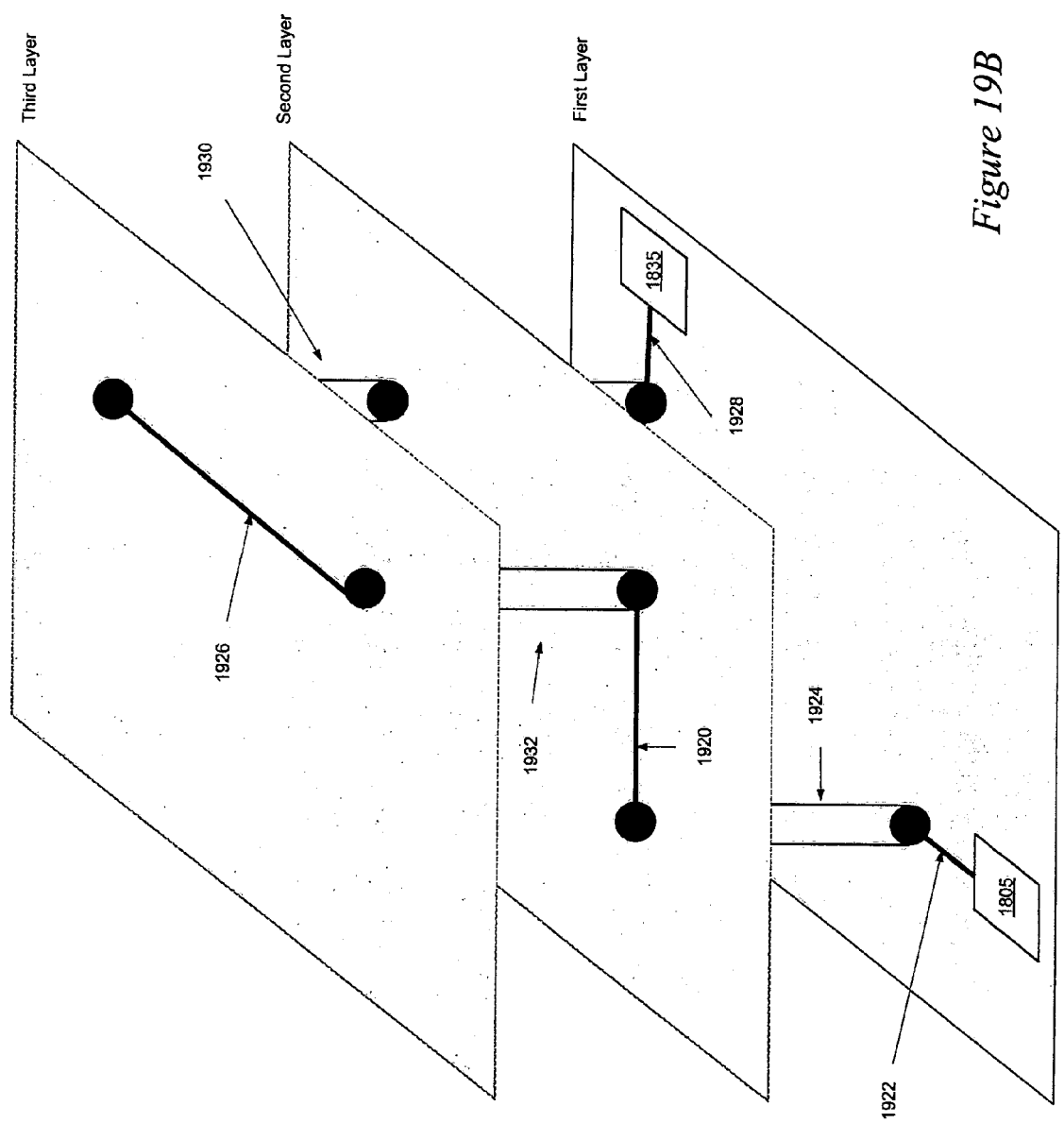

In other instances, the set of wire segments that establish a direct connection between two circuits are on several wiring layers. For example, in some cases, the direct connection between circuits 1805 and 1830 has a geometric realization that is similar to the representation illustrated in FIG. 18. FIG. 19B illustrates an example of this geometric realization. As shown in this figure, a geometric realization can be established by two wire segments on two different wiring layers, which are: (1) a vertical segment 1920 (on layer 2) that connects to horizontal terminal 1922 (on layer 1) of the circuit 1805 through a via connection 1924, and (2) a horizontal segment 1926 (on layer 3) that connects to vertical terminal 1928 (on layer 1) of the circuit 1835 through a stacked via connection 1930 and connects to the vertical segment 1920 through a via connection 1932.

Figure 19C:
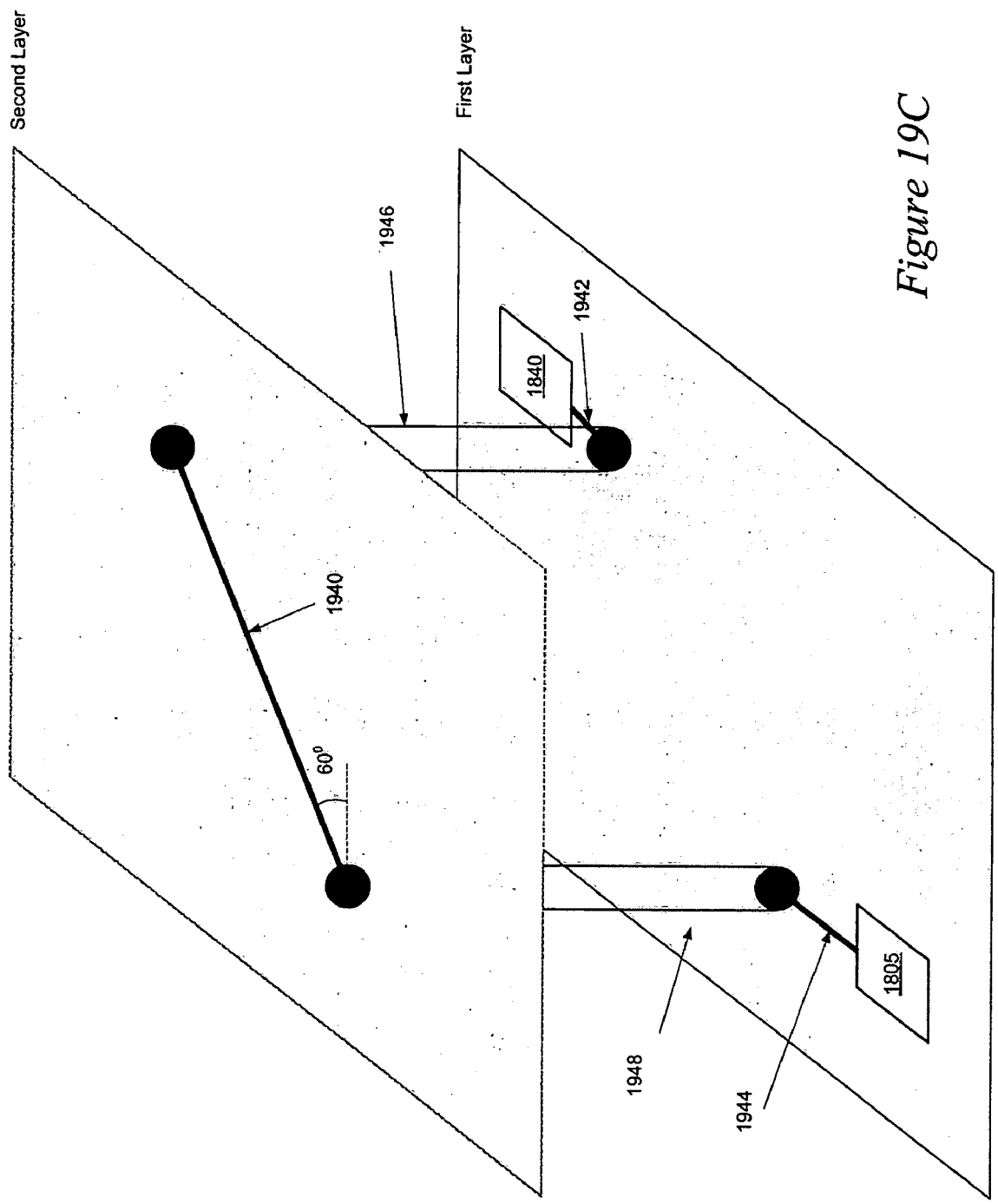

When the VPGA uses a wiring model that allows occasional or systematic diagonal wiring (e.g., octilinear or hexalinear model), a direct connection between two circuits can be established by one or more diagonal wire segments possibly in conjunction with one or more Manhattan (i.e., horizontal or vertical) segments. For the direct connection between circuits 1805 and 1835, FIG. 19C illustrates an example of a geometric realization that is achieved by using a diagonal segment 1940. This diagonal segment is in the 60°-direction on a second wiring layer, which has the 60°-direction as its preferred wiring direction. This segment connects to the vertical terminal 1942 (on layer 1) of circuit 1840 and the vertical terminal 1944 (on layer 1) of circuit 1305a through stacked via connections 1946 and 1948.

IV. Different Direct-Connection Schemes

Figure 20:
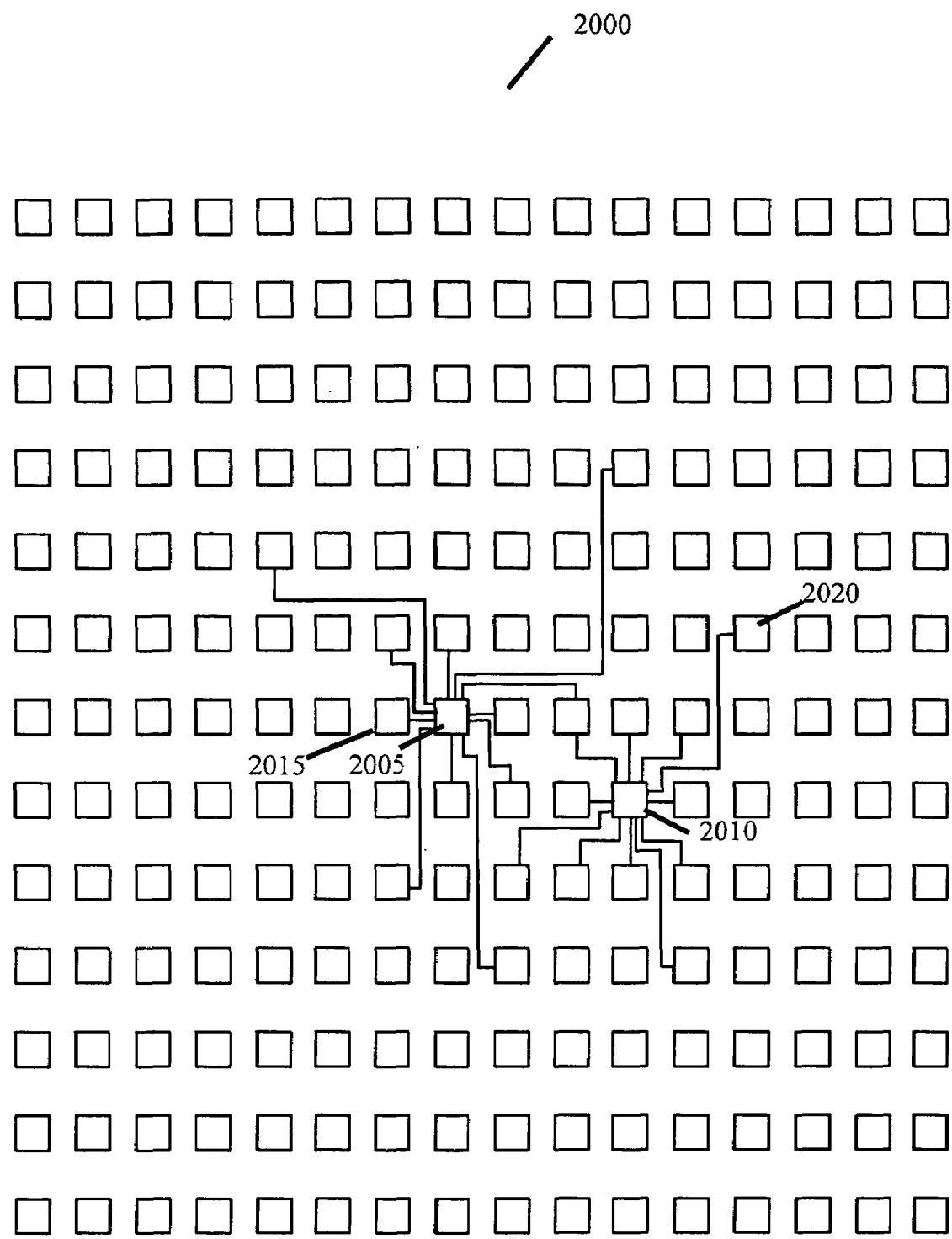
FIG. 20 illustrates a configurable circuit arrangement that use two different direct-connection schemes for two similar circuits in a configurable circuit arrangement.

Some embodiments provide VPGA's that use several different direct connection schemes for the same types of circuits in a configurable circuit arrangement. FIG. 20 illustrates one such embodiment. Specifically, this figure illustrates a configurable circuit arrangement 2000 that use two different direct-connection schemes for two circuits 2005 and 2010 in the circuit arrangement. Some or all of the circuits in the circuit arrangement 2000 are VP configured circuits or include one or more VP configured circuit.

The circuits 2005 and 2010 are of the same type. In some embodiments, two circuits are of the same type when they have the same circuit elements with one or more of these identical elements being configurable. In some embodiments, two circuits of the same type also have the same internal wiring between their identical circuit elements. For instance, in some embodiments, the circuits 2005 and 2010 are two switchboxes that have the same component circuit elements and interconnect wiring between the circuit elements.

Tables 2 and 3 below respectively identify the direct connections of circuits 2005 and 2010. Like Table 1, each of these tables identifies a direct connection between a particular circuit and one of its neighboring circuits in terms of two coordinates, a delta-column coordinate and a delta-row coordinate. For instance, the third record in Table 2 specifies a delta-column coordinate of −1 and delta-row coordinate of 0. This record specifies a direct connection between circuit 2005 and the circuit 2018 directly to the left of it. Alternatively, the fifth record in Table 3 specifies a delta-column coordinate of 2 and a delta-row coordinate of 2. This record specifies a direct connection between circuit 2010 and the circuit 2020, which is two rows above and two columns to the right of the circuit 2010.

TABLE 2

Direct Connections of Circuit 2005

| Delta-Column | Delta-Row |
|---|---|
| 1 | 0 |
| 0 | 1 |
| −1 | 0 |
| 0 | −1 |
| 2 | 0 |
| 3 | 3 |
| −3 | 2 |
| −1 | 1 |
| −1 | −2 |
| 1 | −3 |
| 1 | −1 |

TABLE 3

Direct Connections of Circuit 2010

| Delta-Column | Delta-Row |
|---|---|
| 1 | 0 |
| 0 | 1 |
| −1 | 0 |
| 0 | −1 |

TABLE 3-continued

Direct Connections of Circuit 2010

| Delta-Column | Delta-Row |
|---|---|
| 2 | 2 |
| 1 | 1 |
| −1 | 1 |
| −2 | −1 |
| −1 | −1 |
| 1 | −2 |
| 1 | −1 |

Figure 21:
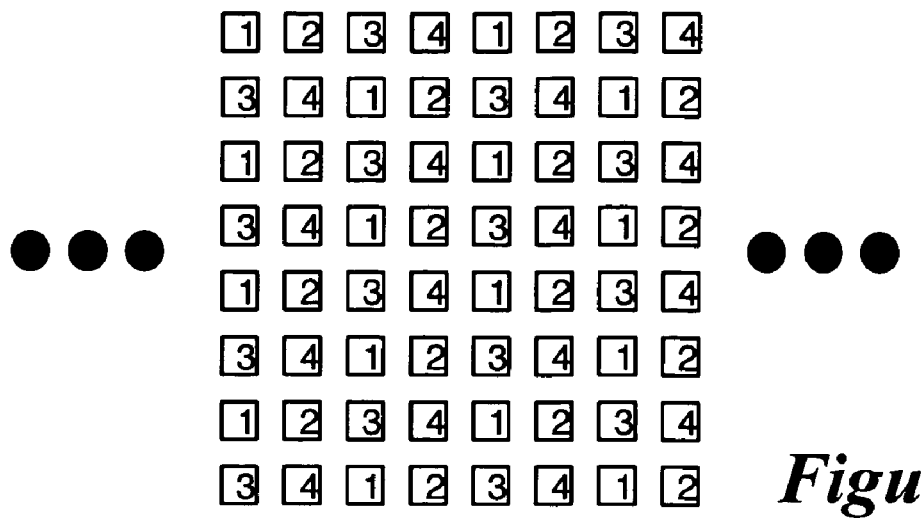
FIG. 21 illustrates a portion of a configurable circuit arrangement that has four different direct-connection schemes.

Some embodiments of the invention use several different direct connection schemes for similar circuit types in a configurable circuit arrangement. One such embodiment is illustrated in FIG. 21. This figure illustrates a portion of a configurable circuit arrangement 2100 that has four different direct-connection schemes. Specifically, each circuit in this circuit arrangement has one of four direct connection schemes, as illustrated by the labels 1, 2, 3, and 4 in FIG. 21.

FIGS. 22-25 provide topological illustrations of four direct connection schemes that can be used as the four schemes illustrated in FIG. 21. Table 4 below identifies the four direct connection schemes illustrates in FIGS. 22-25. This table identifies each connection scheme in terms of eight vectors, where each vector is specified as a pair of delta-column and delta-row coordinates. For instance, the eighth column, third row of Table 4 identifies the seventh direct-connection vector of the second connection scheme as a vector with the coordinates −1,2. This vector specifies a direct connection between a circuit 2305 and a circuit 2310 that is one column to the left of and two rows above the circuit 2305.

TABLE 4

Direct Connection Schemes 2200-2500

| Connection Scheme | 1st Vector | 2nd Vector | 3rd Vector | 4th Vector | 5th Vector | 6th Vector | 7th Vector | 8th Vector |
|---|---|---|---|---|---|---|---|---|
| 1 (2200) | 1, 0 | 0, 1 | −1, 0 | 0, −1 | 1, 1 | −3, 0 | 2, 1 | 8, 8 |
| 2 (2300) | 0, 1 | −1, 0 | 0, −1 | 1, 0 | −1, 1 | 0, −3 | −1, 2 | −8, 8 |
| 3 (2400) | −1, 0 | 0, −1 | 1, 0 | 0, 1 | 1, −1 | −3, 0 | 2, −1 | 8, −8 |
| 4 (2500) | 0, −1 | 1, 0 | 0, 1 | −1, 0 | −1, −1 | 0, 3 | −1, −2 | −8, −8 |

As indicated in Table 4, each of the four connection schemes illustrated in FIGS. 22-25 has direct connections with its four closest horizontally and vertically aligned neighbors. Each of these connection schemes also has four long-offset direct connections. These connections are identified as the fifth, sixth, seventh, and eighth vectors in Table 4.

As apparent from the numerical values of the vectors specified in Table 4, the connection schemes illustrated in FIGS. 22-25 have a symmetrical relationship with respect to each other. According to this symmetrical relationship, each vector (a, b) in the first connection scheme (illustrated in FIG. 22) has a corresponding symmetrically related vector in each of the other three connection schemes. These symmetrically related vectors in the second, third, and fourth connection schemes respectively are: (−b,a), (a,−b), and (−b, −a). For example, the seventh vector (2, 1) in the first connection scheme is symmetrically related to the following vectors in the second, third, and fourth connection schemes: (−1, 2), (2, −1), and (−1, −2).

Figure 26:
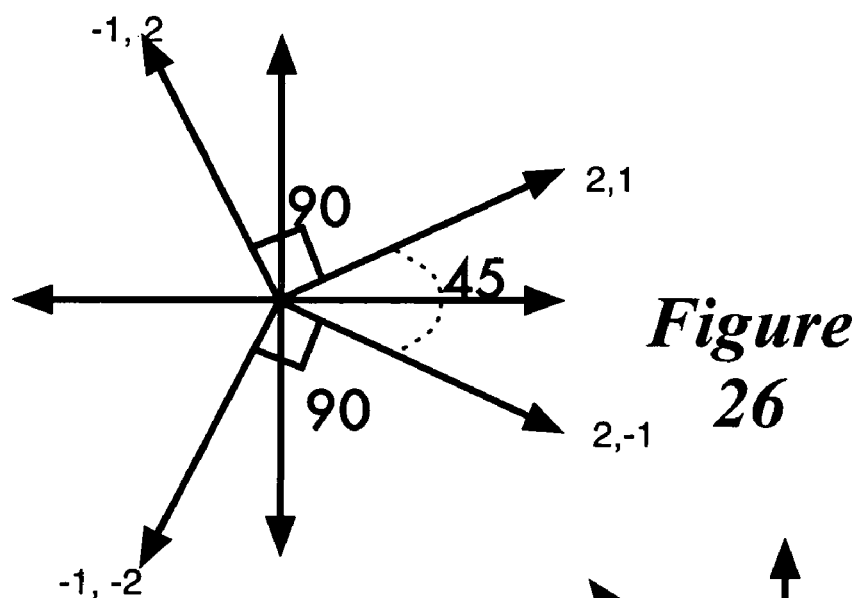
FIG. 26 pictorially illustrates the symmetrical relationship between the four connection schemes illustrated in FIGS. 22-25.

FIG. 26 pictorially illustrates the symmetrically related seventh vectors in these four connection schemes. FIG. 26 also illustrates another way of expressing the symmetrical relationship between vectors in the four connection schemes of FIGS. 22-25. As shown in FIG. 26, (1) each vector (e.g., the $5^{th}$ vector) in the second connection scheme 2300 is 90° rotated in the counterclockwise direction with respect to its corresponding vector (e.g., the $5^{th}$ vector) in the first connection scheme 2200, (2) each vector in the third connection scheme 2400 is 45° rotated in the clockwise direction with respect to its corresponding vector in the first connection scheme 2200, and (3) each vector in the fourth connection scheme 2500 is 135° rotated in the clockwise direction with respect to its corresponding vector in the first connection scheme 2200.

Figure 27:
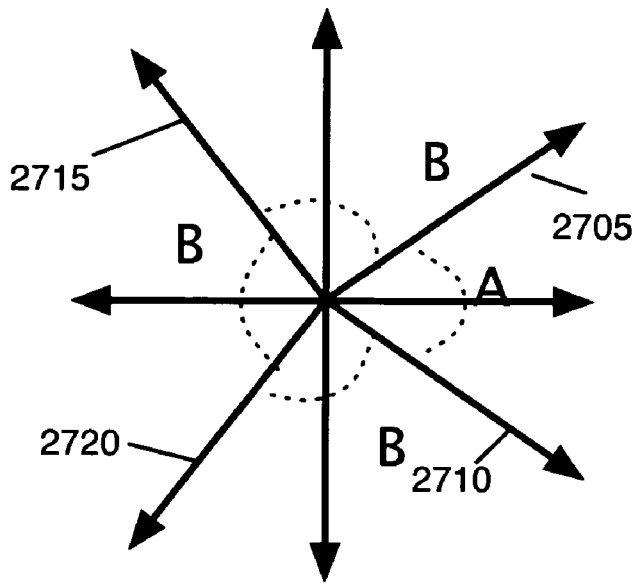
FIG. 27 pictorially illustrates another possible symmetrical relationship that can be used by four symmetrically related connection schemes.
Figure 22:
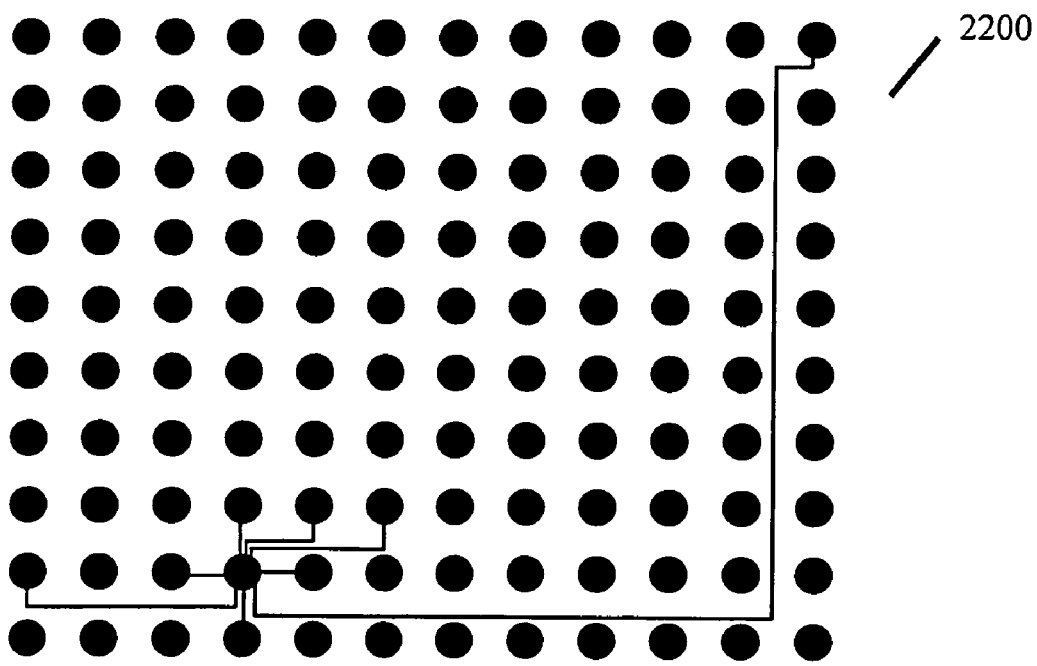
FIGS. 22-25 provide topological illustrations of four direct connection schemes that can be used as the four schemes illustrated in FIG. 21.
Figure 23:
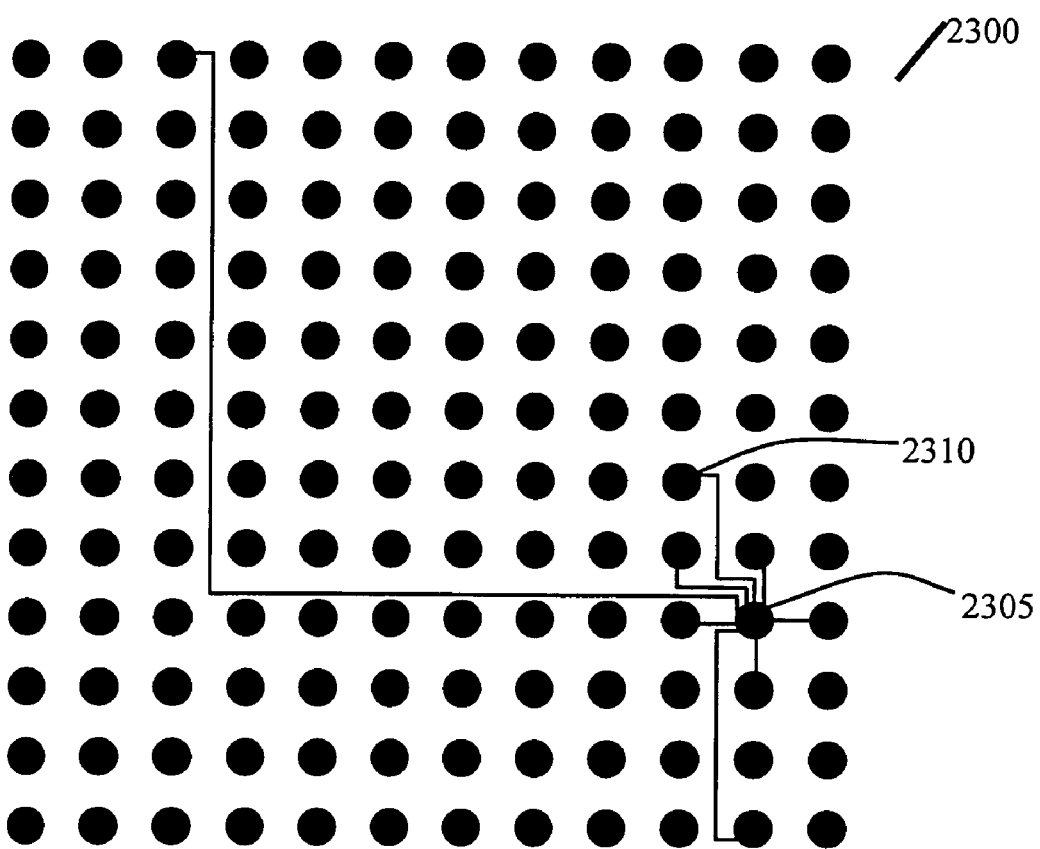
Figure 24:
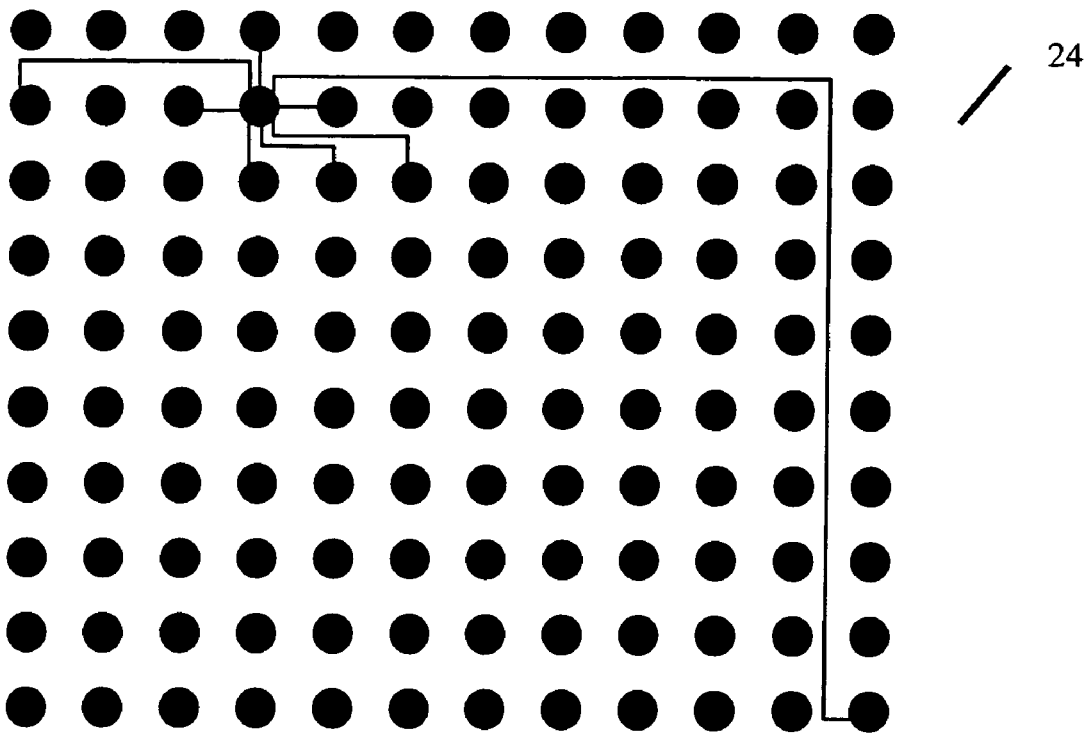
Figure 25:
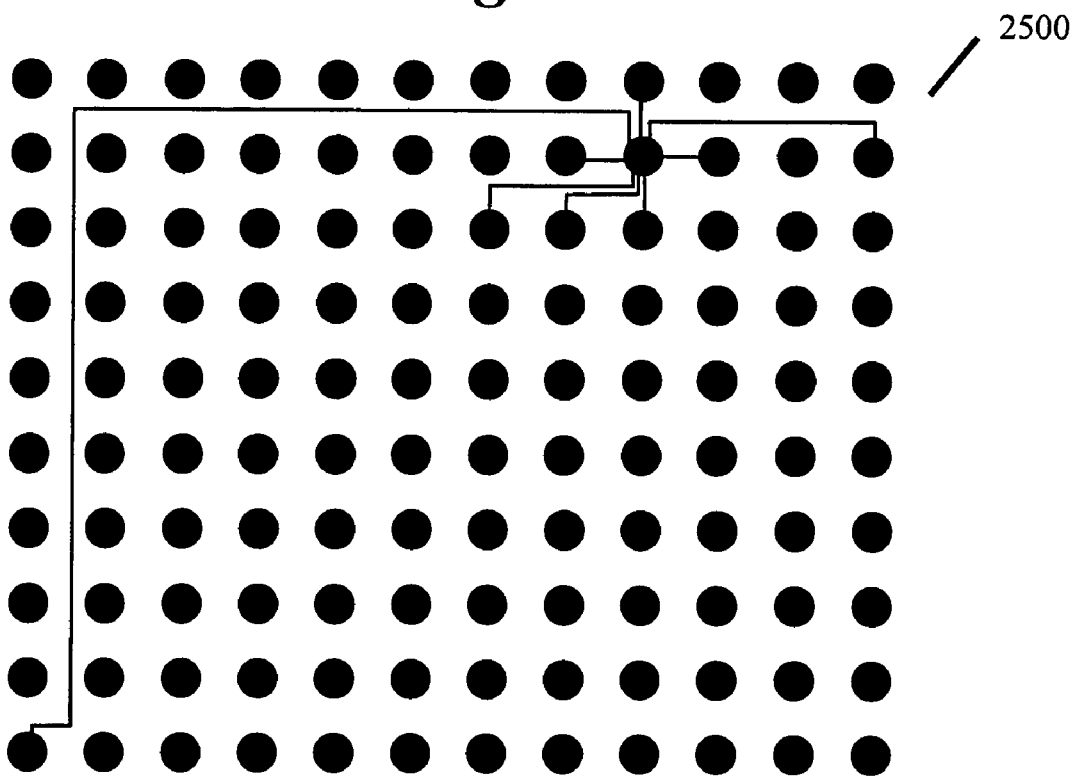

Other embodiments use other symmetrical relationships to generate other sets of symmetrical connection schemes. FIG. 27 illustrates an alternative symmetrical relationship between four connection schemes. According to this symmetrical relationship, each vector in a first connection scheme has a corresponding symmetrically related vector in each of three other connection schemes. Specifically, a vector 2705 in the first connection scheme has (1) a corresponding vector 2710 in the second connection scheme, which is identical to vector 2705 except that it has been rotated by an angle A in the clockwise direction, (2) a corresponding vector 2715 in the third connection scheme, which is identical to vector 2705 except that it has been rotated by an angle B (where B equals (360−A)/3) in the counterclockwise direction, and (3) a corresponding vector 2720 in the fourth connection scheme, which is identical to vector 2705 except that it has been rotated by an angle 2*B in the counterclockwise direction.

One of ordinary skill will realize that other embodiment might use fewer or more connection schemes for circuits of the same type in a configurable circuit arrangement. For instance, some embodiments might only use two connection schemes. Also, in other embodiments, some or all of the connection schemes are not symmetrically related to the other connections schemes. In addition, some embodiments do not include unit vectors or the same set of unit vectors in each connection scheme. Furthermore, in some embodiments, the different connection schemes define different number of long-offset direct connections for the same type of configurable circuits.

V. Process for Specifying Different Direct-Connection Schemes

Some embodiments of the invention provide a method that defines a set of connections for connecting circuits in a VPGA with a configurable circuit arrangement, which, in some embodiments, are the same type of circuits. Some or all of the circuits in the circuit arrangement are VP configured circuits or include one or more VP configured circuit. This method examines several different sets of connections for connecting a set of the circuits. In each of the identified sets, the method then computes a metric score that quantifies a quality of the identified set of connections in connecting the configurable circuits. The method then selects at least one of the identified sets of connections for connecting the configurable circuits in the circuit arrangement.

Different embodiments might use different metric scores that optimize different qualities of the connection sets. For instance, in some embodiments, the metric score might express the number of circuits reachable from a circuit. This metric score optimizes the overall reachability. In other embodiments, the metric score might express length constraints, reconvergence, reachability within a particular number of "hops," prioritized reachability, etc. (where a hop is a direct connection between two circuits).

Figure 28:
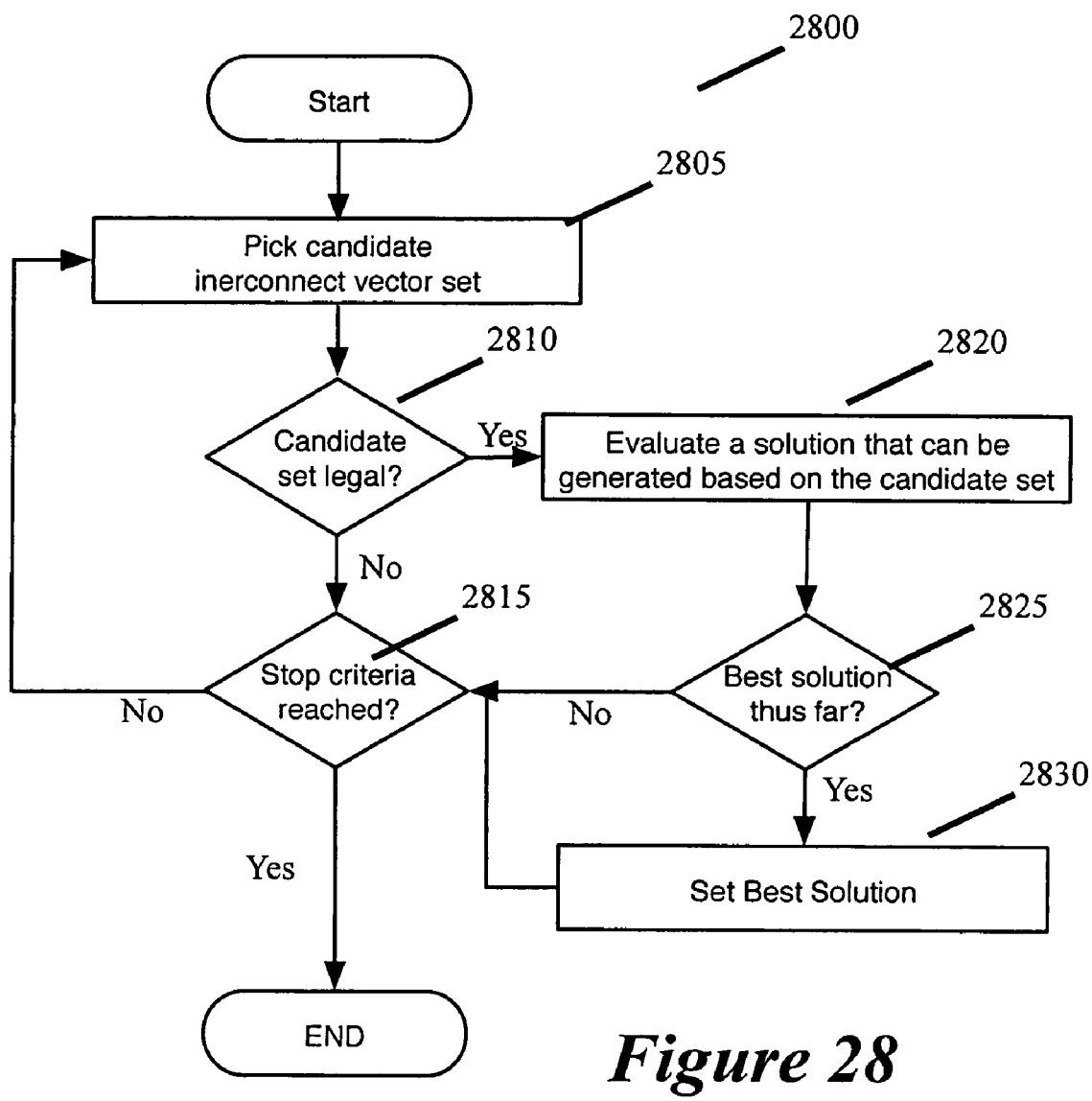
FIGS. 28 and 29 illustrate an optimization process that generates and examines different direct-connection schemes for different configurable circuits in a configurable circuit arrangement.

Different embodiments use different optimization techniques to optimize the metric score that quantifies the quality of the identified set of connections. For instance, some embodiments use complex constrained optimization techniques, such as local optimization, simulated annealing, etc. Other embodiments use less complex techniques. One example of a simple constrained optimization technique is illustrated in FIG. 28. Specifically, this figure illustrates a process 2800 that randomly generates and examines different direct-connection schemes for different configurable circuits in a configurable circuit arrangement. This process tries to identify a set of connection schemes that enables a maximally dispersed exploration of a circuit graph that corresponds to a configurable circuit arrangement.

As shown in this figure, the process 2800 initially generates (at 2805) a candidate connection-vector set for a single direct-connection scheme. In some embodiments, the candidate-vector set generated at 2805 includes only the direct-connection vectors that will differ among the direct-connection schemes specified by the process 2800. For instance, the process does not generate any unit vectors at 2805 when each direct-connection scheme is to have the same set of unit vectors. In some embodiments, the process generates (at 2805) the candidate connection-vector set randomly based on a set of constraints, such as the number of vectors in the set, the maximum length for any given vector, etc.

After 2805, the process determines (at 2810) whether the candidate set generated at 2805 is an acceptable candidate set. In some embodiments, the process makes this determination by checking whether the specified set meets a set of constraints. These constraints can relate to some desired numerical attribute or attributes of the candidate vector set (such as the average length of vectors in the set, the maximum edge length, the total edge length) or some other constraint related to the candidate vector set (e.g., congestion based metrics based on the expected congestion caused by a candidate vector set). Some embodiments use only one constraint (e.g., the average vector length) while other embodiments use multiple constraints. Also, some embodiments compute vector lengths by assuming a Euclidean ("all-angle") wiring, while other embodiments compute lengths based on other wiring models, such as a Manhattan model, an octilinear model, a hexalinear model, etc.

When the process determines (at 2810) that the candidate vectors set is acceptable, the process evaluates (at 2820) the candidate vector set. One example of such an evaluation will be described below by reference to FIG. 29. As further described below, the evaluation process of FIG. 29 generates other candidate vector sets that have a symmetrical relationship to the vector set specified at 2805, and then uses all the candidate sets to compute a metric score that relates to the number of unique circuits that are reachable from other circuits through different number of hops, where, as mentioned above, a hop refers to a direct connection between two circuits.

After evaluating the candidate vector set, the process determines (at 2825) whether the candidate vector set resulted in the best solution that it has generated thus far. In some embodiments, the process makes the determination at 2825 based on the metric score computed by the evaluation process at 2820. If the process determines (at 2825) that the candidate vector set did not result in the best solution, the process transitions to 2815, which will be further described below. On the other hand, when the candidate vector set results in the best solution, the process records (at 2830) the candidate vector set as the best solution. In some embodiments, the process records (at 2830) not only the candidate vector set specified at 2805 but also its symmetrically related vector sets that the evaluation process 2900 of FIG. 29 generates. After 2830, the process transitions to 2815. The process also transitions to 2815 when it determines (at 2810) that the candidate vector set is not acceptable.

At 2815, the process determines whether it has examined sufficient number of candidate vector sets. When the process determines (at 2815) that it has not examined a sufficient number of candidate vector sets, the process returns to 2805 to start its operation again. Otherwise, the process ends. In some embodiments, the process 2800 loops automatically without the stopping criteria at 2815, until the process is stopped by an operator or another process.

Figure 29:
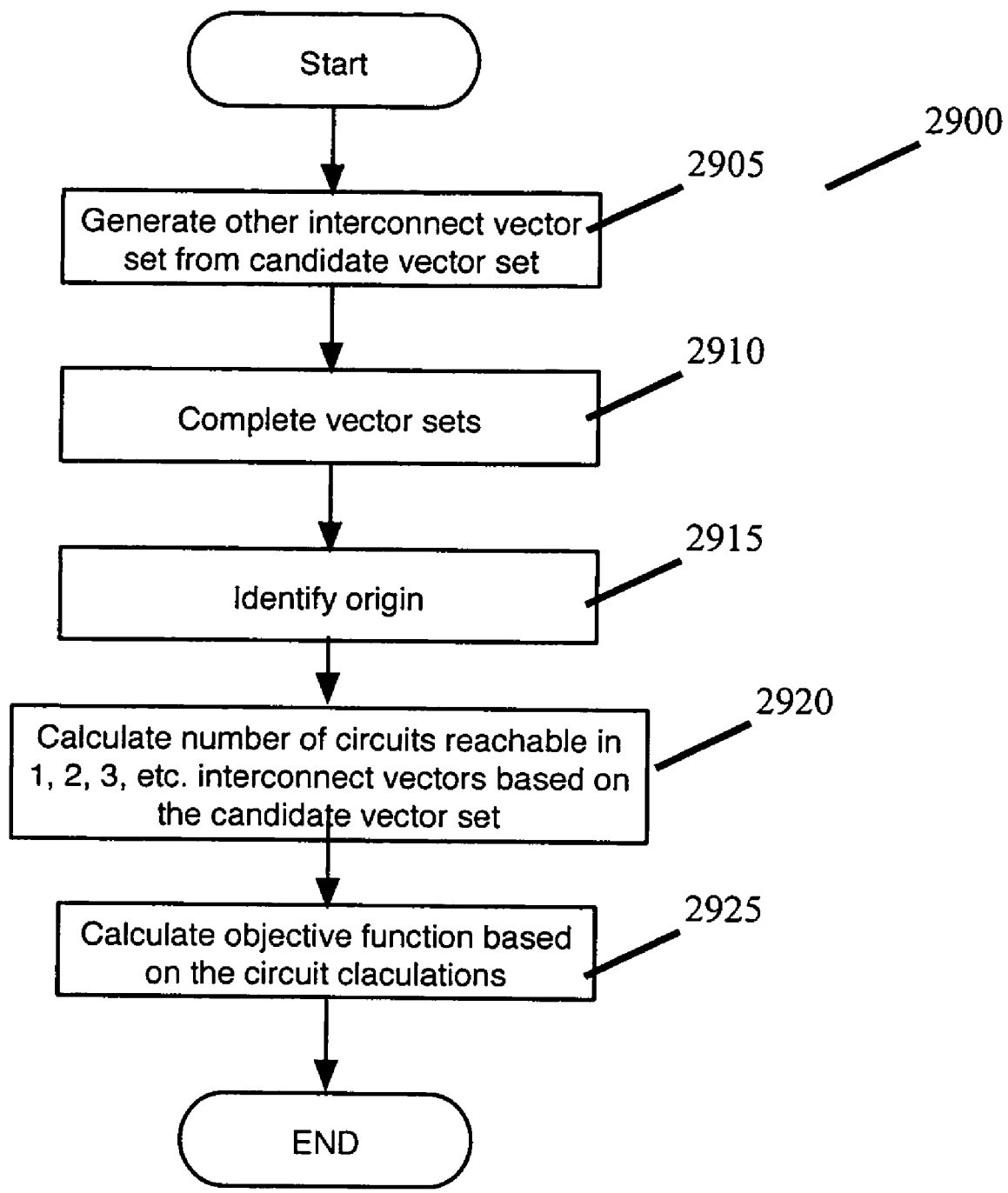

FIG. 29 illustrates a process 2900 that some embodiments use to perform the evaluation operation 2820 of the process 2800. As shown in this figure, the process 2900 initially generates (at 2905) other candidate vector sets that have a symmetrical relationship to the vector set specified at 2805. In some embodiments, the process 2900 generates the vector sets by using one of the symmetrical relationships that were described above by reference to FIGS. 22-27.

Next, in some embodiments, the process adds (at 2910) to each vector set the set of vectors that are common among the vectors sets. For instance, in some embodiments, each vector set will include the four unit vectors in the horizontal and vertical directions (i.e., will include (1,0), (0,1), (−1,0), and (0, −1)). Accordingly, in these embodiments, the process adds (at 2910) these four unit vectors to each vector set.

After 2910, the process selects (at 2915) a circuit in the circuit arrangement as its origin. In some embodiments, this circuit is the circuit that is closest to the center of the circuit arrangement. Based on the candidate vector sets generated at 2905 and completed at 2910, the process then calculates (at 2920) all circuits that can be reached from the designated circuit origin in different number of hops (e.g., 1, 2, 3, etc.). Some embodiments use a breadth-first search to perform this calculation.

Based on the calculated numbers, the process then computes a metric score at 2925. Some embodiments use the following equation to compute a metric score.

$$\text{Score} = \frac{\sum_{i=0}^{X} i * R(i) - R(i-1)}{R(X)}, \quad (1)$$

where R is the calculated number of circuits that are reachable within one to i hops, n is the number of rows or number of columns, in a circuit arrangement that may or may not be a square circuit arrangement, and X is an integer (e.g., 5, 10, 100, 1000, etc.). This score approximates the expected length from the origin (i.e., the circuit selected at 2915) to a random circuit in the circuit arrangement.

Other embodiments use either of the following equations in place of, or in conjunction with, the equation (1) above.

$$\text{Score} = \sum_{i=0}^{10} \frac{R(i)}{i}, \quad (2)$$

$$\text{Score} = \sum_{i=0}^{10} \frac{R(i)}{i^2}, \quad (3)$$

where R and i are as defined above for equation (1). To use the scores of several of the above equations in conjunction with each other, some embodiments compute a blended sum of these scores.

After 2925, the process 2900 ends.

Table 5 provides metric scores that are generated by equation (1) for different connection schemes that are produced by using the processes 2800 and 2900 of FIGS. 28 and 29 under different sets of constraints for different sized circuit arrangements. The constraints are the number of non-unit/offset vectors in the connection scheme and the total length of the non-unit/offset vectors. Each of these connections schemes also has four unit vectors connecting the circuit to its four nearest neighboring circuits in the horizontal and vertical directions. Table 5 also illustrates the number of circuits that are reachable from a given circuit in three hops on average.

TABLE 5

| Number of Offset or Non-Unit Vectors | Total Length of Offset or Non-Unit Vectors | Score in a 100x100 circuit arrangement | Score in a 70x70 circuit arrangement | Score in a 40x40 circuit arrangement | Circuits reachable in 3 hops |
|---|---|---|---|---|---|
| 4 | 80 | 7.95 | 6.64 | 4.89 | 115.5 |
| 4 | 128 | 6.81 | 5.65 | 4.26 | 340 |
| 4 | 176 | 6.06 | 5.17 | 3.92 | 477.5 |

Figure 2:
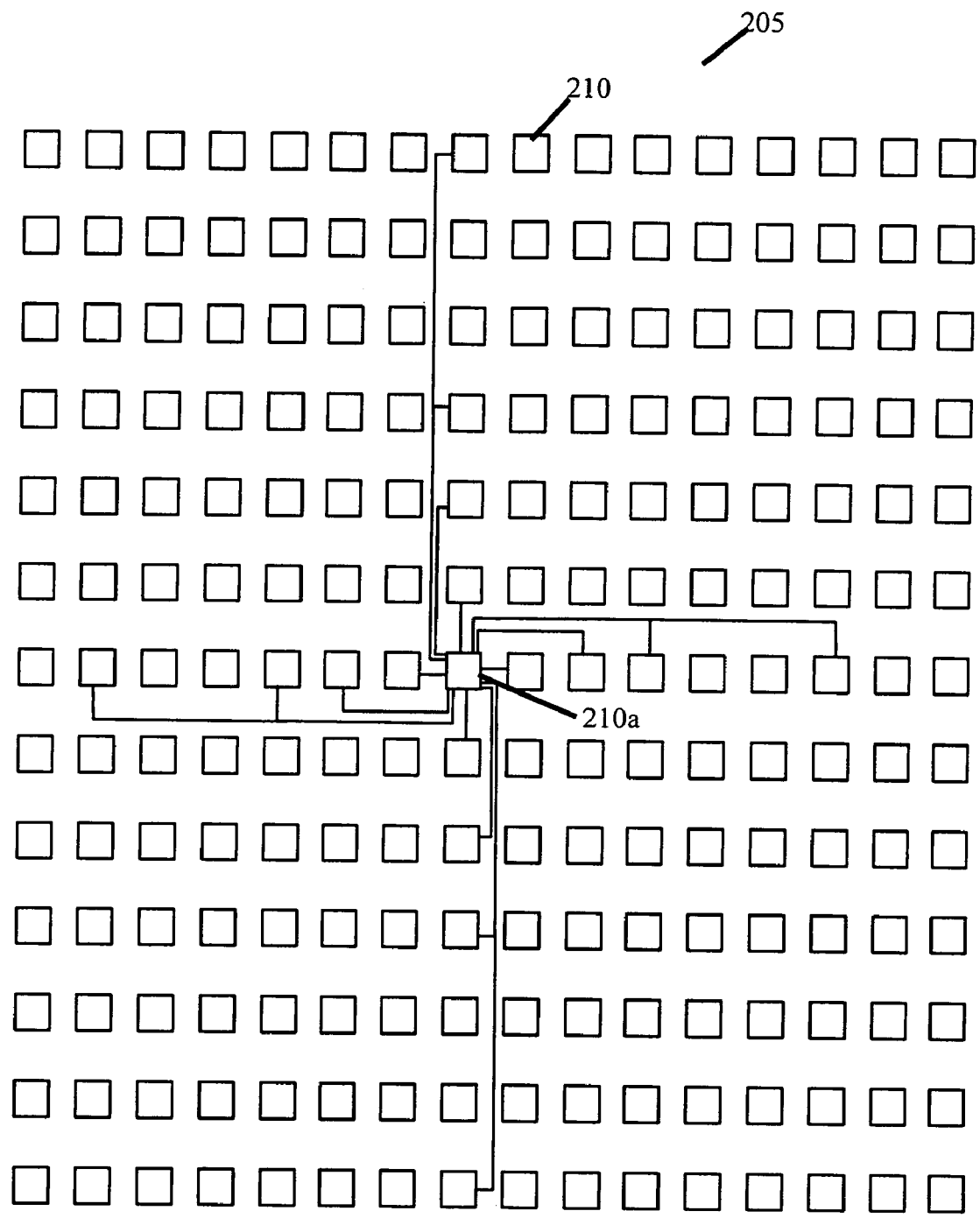
FIG. 2 illustrates several connections in a prior configurable IC architecture
Figure 3:
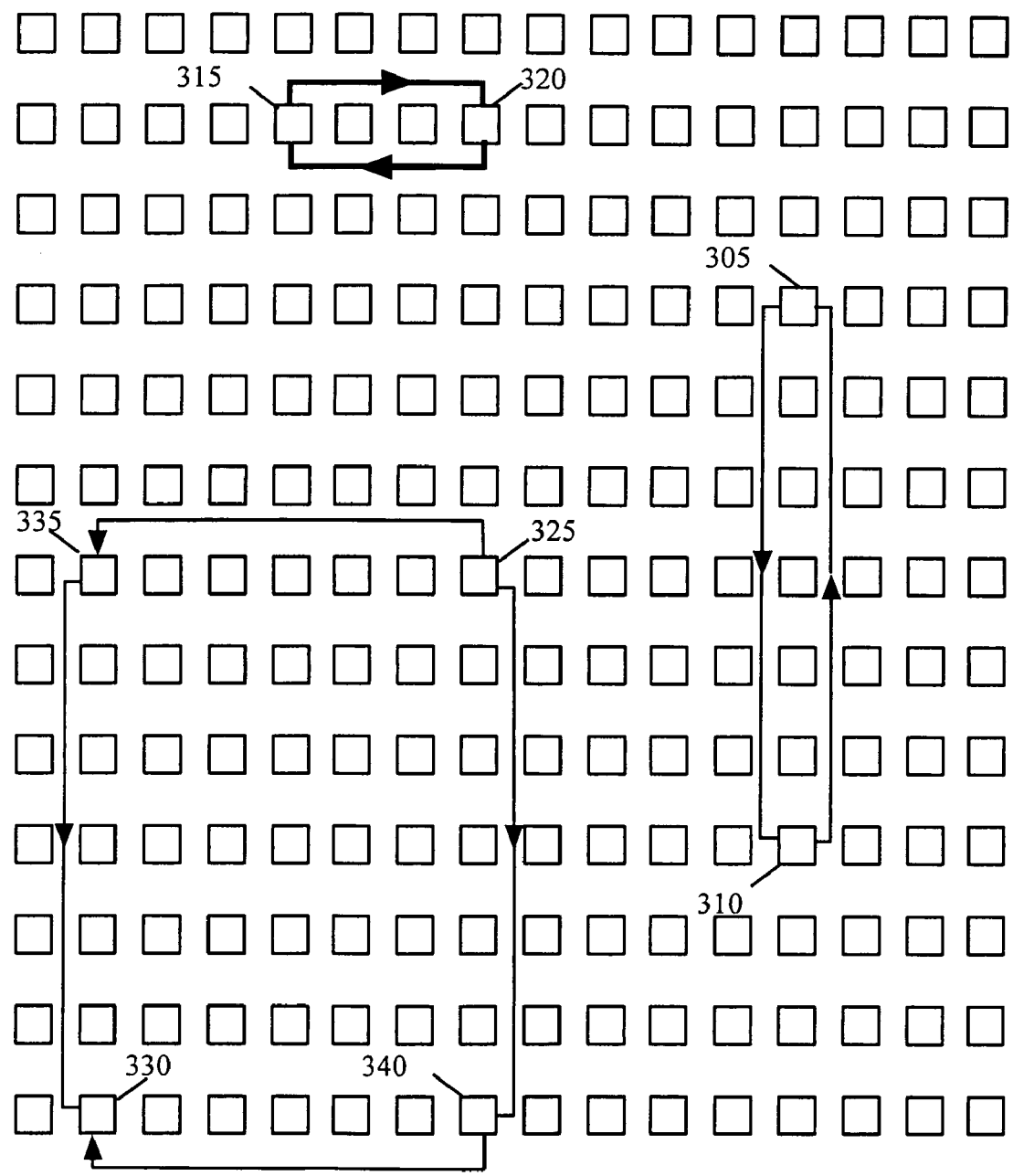
FIG. 3 illustrates shortcomings of the architecture presented in FIG. 2.

Table 6 provides a comparable set of numbers for a configurable circuit arrangement that is interconnected through the prior art connection scheme illustrated in FIG. 2. Specifically, the second row in this table identifies the equation (1) metric score and hop data for a connection scheme that connects each circuit that are one, two, or three units away from it in the horizontal or vertical directions. The third row identifies the score and hop data for a connection scheme that connects each circuit to circuits that are one, two, six units away from it in the horizontal or vertical directions. The fourth row identifies the score and hop data for a connection scheme that connects each circuit to circuits that are one, two, three, or six units away from it in the horizontal or vertical directions.

TABLE 6

| Vectors | Total Length of Offset/Non-Unit Vectors | Score in a 100x100 circuit arrangement | Score in a 70x70 circuit arrangement | Score in a 40x40 circuit arrangement | Circuits reachable in 3 hops |
|---|---|---|---|---|---|
| (0, 1) (1, 0) (0, −1) (−1, 0) (0, 2) (2, 0) (0, −2) (−2, 0) (0, 3) (3, 0) (0, −3) (−3, 0) | 80 | 17.3 | 12.3 | 7.35 | 145 |
| (0, 1) (1, 0) (0, −1) (−1, 0) (0, 2) (2, 0) (0, −2) (−2, 0) (0, 6) (6, 0) (0, −6) (−6, 0) | 128 | 10.1 | 7.7 | 5.12 | 241 |
| (0, 1) (1, 0) (0, −1) (−1, 0) (0, 2) (2, 0) (0, −2) (−2, 0) (0, 3) (3, 0) (0, −3) (−3, 0) (0, 6) (6, 0) (0, −6) (−6, 0) | 176 | 9.82 | 7.33 | 4.8 | 321 |

The second, third, and fourth rows in Table 6 are comparable to the second, third, and fourth rows in Table 5 as the total length of vectors of the connection schemes of these rows are equal. As it can be seen by comparing the score and hop data of the comparable rows in Tables 5 and 6, the connection schemes that result from the constraints specified in Table 5 result in distinctly better scores and hop values. Such better scores and hop values are because the processes 2800 and 2900 examine numerous connection schemes and select the one that results in the best metric score.

Although the processes 2800 and 2900 was described above, one of ordinary skill will realize that other embodiments can use a variety of other processes to specify different direct-connection schemes for different configurable circuits in a VPGA that includes a configurable circuit arrangement. As mentioned above, these processes might use a variety of other optimization techniques, such as local optimization, simulated annealing, etc. Also, some embodiments use several different connection schemes for a configurable circuit arrangement, with at least two of the connection schemes specifying a different number of long-offset direction connections (e.g., one connection scheme might specify four long-offset direct connections, while another connection scheme might specify six long-offset direct connections).

Instead of generating a first connection scheme and generating the other connection schemes based on the first scheme, some embodiments might partially generate two or more of the connection schemes and then generate the remaining connections based on symmetrical relationships with the partially generated connections of the two or more connection schemes. For instance, some embodiments might generate one vector for each connection scheme, and then rotate each of these vectors through the various symmetrical angles in order to generate the additional vectors of the connection schemes. Alternatively, some embodiments might completely generate two or more of the connection schemes independently from each other.

As mentioned above, the process 2900 selects (at 2915) one circuit in the circuit arrangement and computes (at 2920) the number of circuits reachable from the selected circuit in a set number of hops. This process then uses the computed number of circuits in calculating its metric score at 2925. Other embodiments, however, select (at 2915) several different circuits in the circuit arrangement, calculate (at 2920) the number of circuits reachable from these selected circuits, and then compute (at 2925) the metric score based on the number calculated at 2920. For instance, some embodiments calculate (at 2920) the number of reachable circuits for each circuit in the circuit arrangement. Some of these embodiments then (at 2920) generate an average of these numbers, and use (at 2925) this generated average to generate their metric scores at 2925.

VI. VPGA'S that Include a Configurable Circuit Arrangement with Built-In Turns

Some embodiments provide VPGA's with configurable circuit arrangements that have a systematic series of build-in turns. Such turns can be arranged in a variety of different architectural schemes, such as symmetrical schemes, asymmetrical schemes, nested schemes, any combination of symmetrical, asymmetrical, and/or nested schemes, etc.

Figure 30:
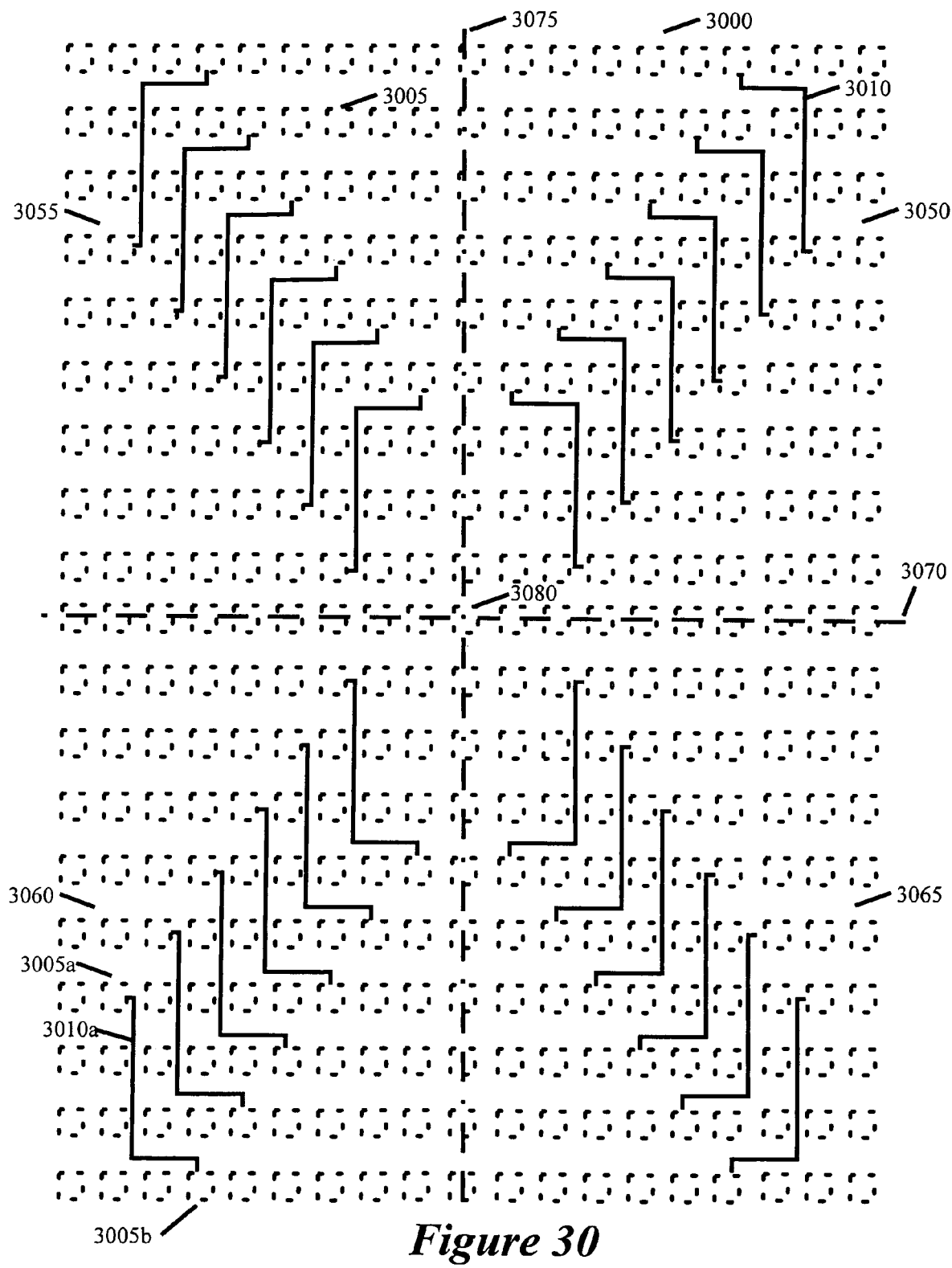
FIGS. 30-34 illustrate several examples of configurable circuits with built-in turns.

FIGS. 30-34 illustrate several examples of symmetrical schemes. FIG. 30 illustrates a configurable circuit arrangement 3000 that has numerous configurable circuits 3005, which are arranged in numerous rows and columns. In some embodiments, some or all of the circuits in the circuit arrangement are VP configured circuits or include one or more VP configured circuit. In some embodiments, the configurable circuits 3005 are all the same type of circuits. For instance, in some embodiments, all the circuits have the same circuit structure (e.g., the same circuit elements). In some embodiments, similar type circuits have the same circuit elements and the same internal wiring between the circuit elements.

Figure 31:
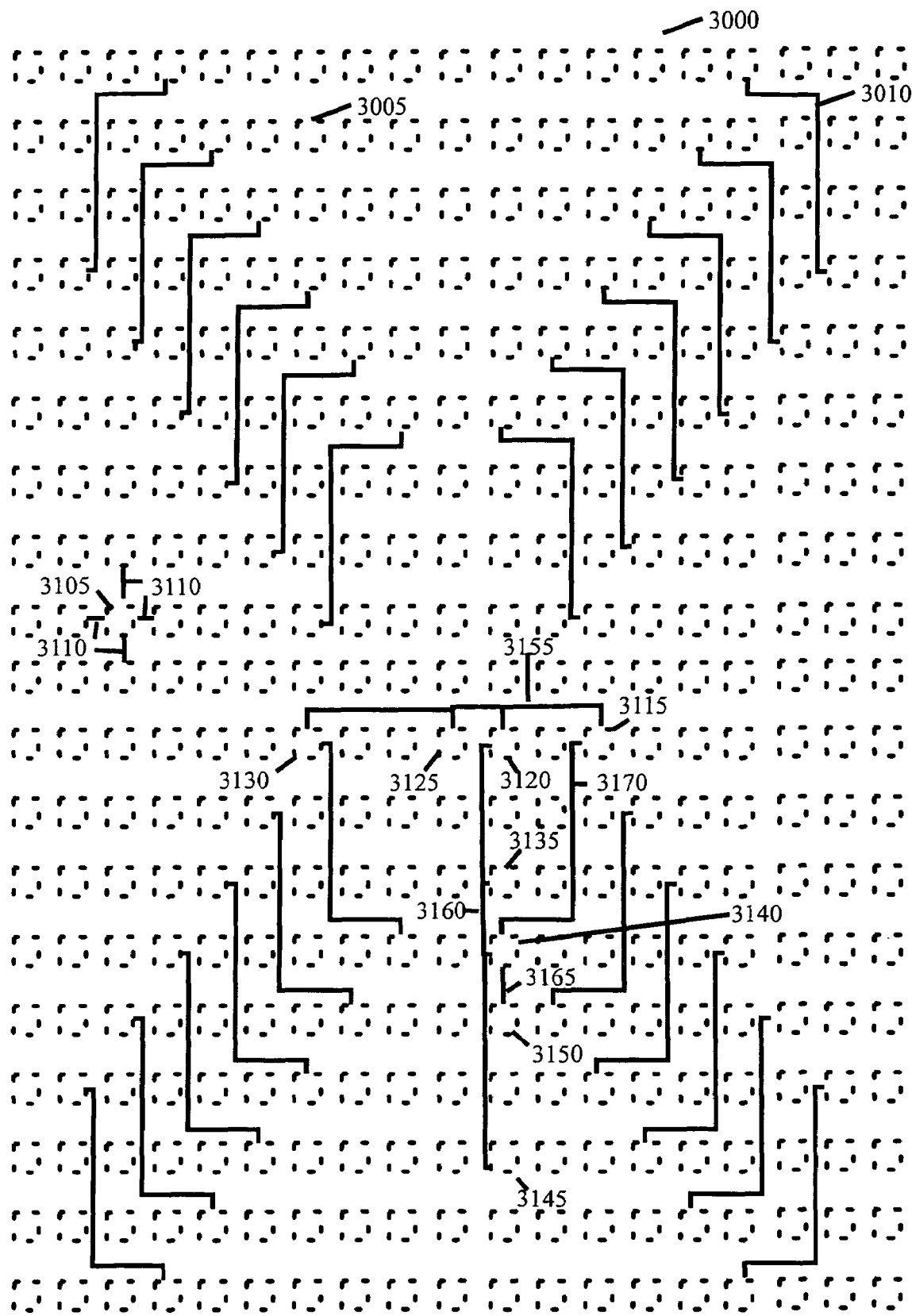

In some embodiments, the circuit arrangement 3000 has numerous direct connections (not shown) between pairs of neighboring circuits that are horizontally or vertically aligned (i.e., that are in the same row or column in the circuit arrangement). FIG. 31 illustrates one such set of direct connections 3110 for a circuit 3105 in the circuit arrangement 3000. Some embodiments have such direct connections between each pair of horizontally or vertically aligned circuits in the circuit arrangement. In conjunction or instead of such connections between pairs of neighboring aligned circuits, the configurable circuit arrangement 3000 in some embodiments also has direct connections between horizontally or vertically aligned circuits that are not neighboring circuits in the circuit arrangement. For instance, FIG. 31 illustrates that the circuit arrangement 3000 has, in some embodiments, a circuit 3115 that connects to non-neighboring circuits 3120, 3125, and 3130 that are horizontally aligned with circuit 3115. This figure also illustrates that the circuit 3120 connects to non-neighboring circuits 3135, 3140, and 3145 that are vertically aligned with it.

In addition to the direct connections between horizontally and vertically aligned circuits, the circuit arrangement 3000 includes numerous direct connections 3010 between circuits that are offset in the circuit arrangement. Specifically, as shown in FIG. 30, the circuit arrangement includes numerous direction connections 3010, where each such connection couples two circuits that are two columns and three rows separated in the circuit arrangement.

Such connections 3010 are referred to as "built-in turns." Built-in turns allow two offset circuits to be connected by relying on wiring architecture that reduces the number of interconnect circuits necessary for establishing the connection between the two circuits. For instance, as shown in FIG. 30, a built-in turn 3010*a* couples two offset circuits 3005*a* and 3005*b* without using any intervening interconnect circuit.

In some cases, built-in turns do not eliminate the need to rely on intervening interconnect circuits, but instead reduce the number of intervening interconnect circuits. For instance, in FIG. 31, circuits 3115 and 3150 can be connected through (1) the horizontal connection 3155 that connects circuits 3115 and 3120, (2) circuit 3120's interconnect circuit (not shown) that allows a change of direction in the set of connecting hops, (3) the vertical connection 3160 that connects circuits 3120 and 3140, (4) circuit 3140's interconnect circuit (not shown) that relays the signal on its input terminal connected to connection 3160 to its output terminal connected to connection 3165, and (5) the vertical connection 3165 between neighboring circuits 3140 and 3150.

Alternatively, as shown in FIG. 31, circuits 3115 and 3150 can be connected through (1) the built-in turn connection 3170 that connects circuits 3115 and 3140, (2) circuit 3140's interconnect circuit that relays the signal on its input terminal connected to connection 3170 to its output terminal connected to connection 3165, and (3) the vertical connection 3165 between neighboring circuits 3140 and 3150. Accordingly, this alternative connection scheme connects the two circuits 3115 and 3150 in two hops instead of the three hops that are required to connect these two circuits through circuits 3120 and 3140. Such a reduction typically reduces the length, and associated delay, of the wire segments necessary to establish the connection between two offset circuits.

Also, the alternative connection scheme that uses the turn connection 3170 reduces reliance on intervening interconnect circuits by eliminating circuit 3120's interconnect circuit from the connection path. Reducing the number of intervening interconnect circuits is often desirable. The use of interconnect circuits adversely affects the VPGA's operational speed, because it requires signals (1) to traverse from the higher wiring layers to the VPGA's substrate for processing by the relatively slow transistor-level logic and then (2) to traverse back to the higher wiring layers from the VPGA's substrate. Interconnect circuits also take valuable real estate on an IC. Therefore, it is often desirable to minimize the use of interconnect circuits so that they can be used only in situations were they are required.

Each built-in turn 3010 in FIGS. 30 and 31 is established by (1) a set of wire segments that traverse through a set of the IC's wiring layers, (2) a set of vias when two or more wiring layers are involved, and (3) possibly a set of buffer circuits. In some embodiments, all the wire segments of all built-in turns 3010 are on the same wiring layer (e.g., layer 4). In these embodiments, no built-in turn 3010 requires a via to connect the turn's four wire segments to each other. (The turns, however, might still require vias to connect to the input and output terminals of circuits in the circuit arrangement.)

Figure 32:
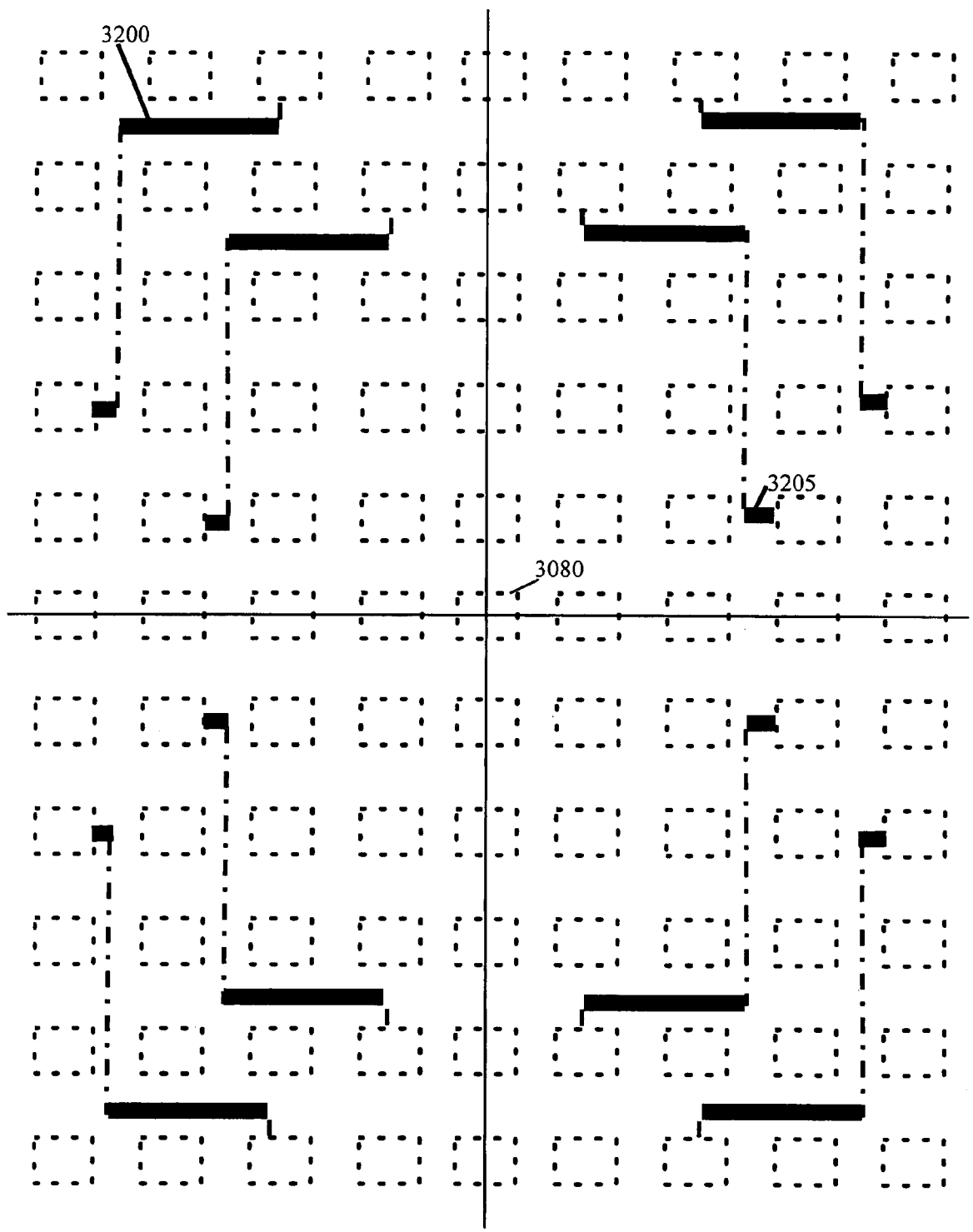
Figure 33:
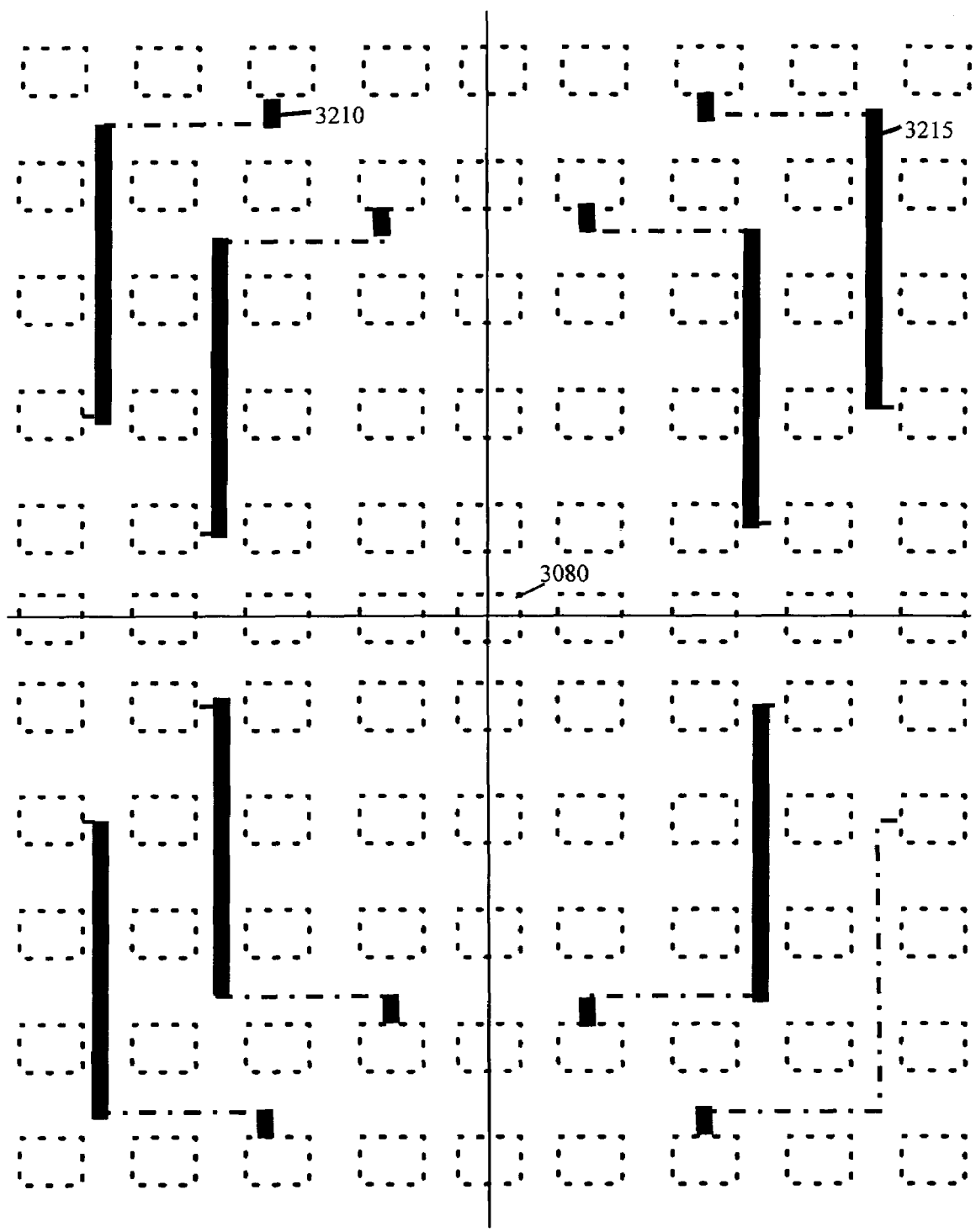

Alternatively, different wire segments of the built-in turns 3010 might be on different wiring layers. For instance, FIGS. 32 and 33 illustrate an alternative architecture for the circuit arrangement 3000 where all the horizontal segments 3200 and 3205 of the turns 3010 are on one wiring layer (e.g., the fourth layer), while all the vertical segments 3210 and 3215 of the turns 3010 are on another wiring layer (e.g., the fifth layer). Such an circuit arrangement would require each turn 3010 to have several (e.g., three) vias to connect its four wire segments 3200, 3205, 3210, and 3215 to each other.

Yet other alternative circuit arrangements can be used in other embodiments, where the wire segments of different built-in turns 3010 of the circuit arrangement 3000 are arranged differently. For instance, in some embodiments, different turns 3010 might have their wiring segments on different wiring layers (e.g., some might have their horizontal segments on layer 4, while others might have their horizontal segments on layer 5). Also, in some embodiments, some turns 3010 might have all their segments on the same wiring layer, while other turns 3010 might have their wiring segments on different wiring layers.

As illustrated in FIGS. 30 and 31, the built-in turns 3010 are a set of turns that are systematically arranged across the entire circuit arrangement or a portion of this circuit arrangement. These turns are arranged symmetrically in some embodiments. For instance, as illustrated FIG. 30, the turns 3010 can be categorized into four sets of turns that are horizontally and/or vertically symmetrically laid out in the circuit arrangement 3000 about an origin 3080 in the circuit arrangement. These four sets are in four quadrants 3050, 3055, 3060, and 3065 of a coordinate system that is specified by an x- and y-axes 3070 and 3075 running through the origin 3080. Each particular set has a symmetrical relationship with the other three sets, as flipping the particular set about the origin in the horizontal and/or vertical directions can generate the other three sets.

Figure 34:
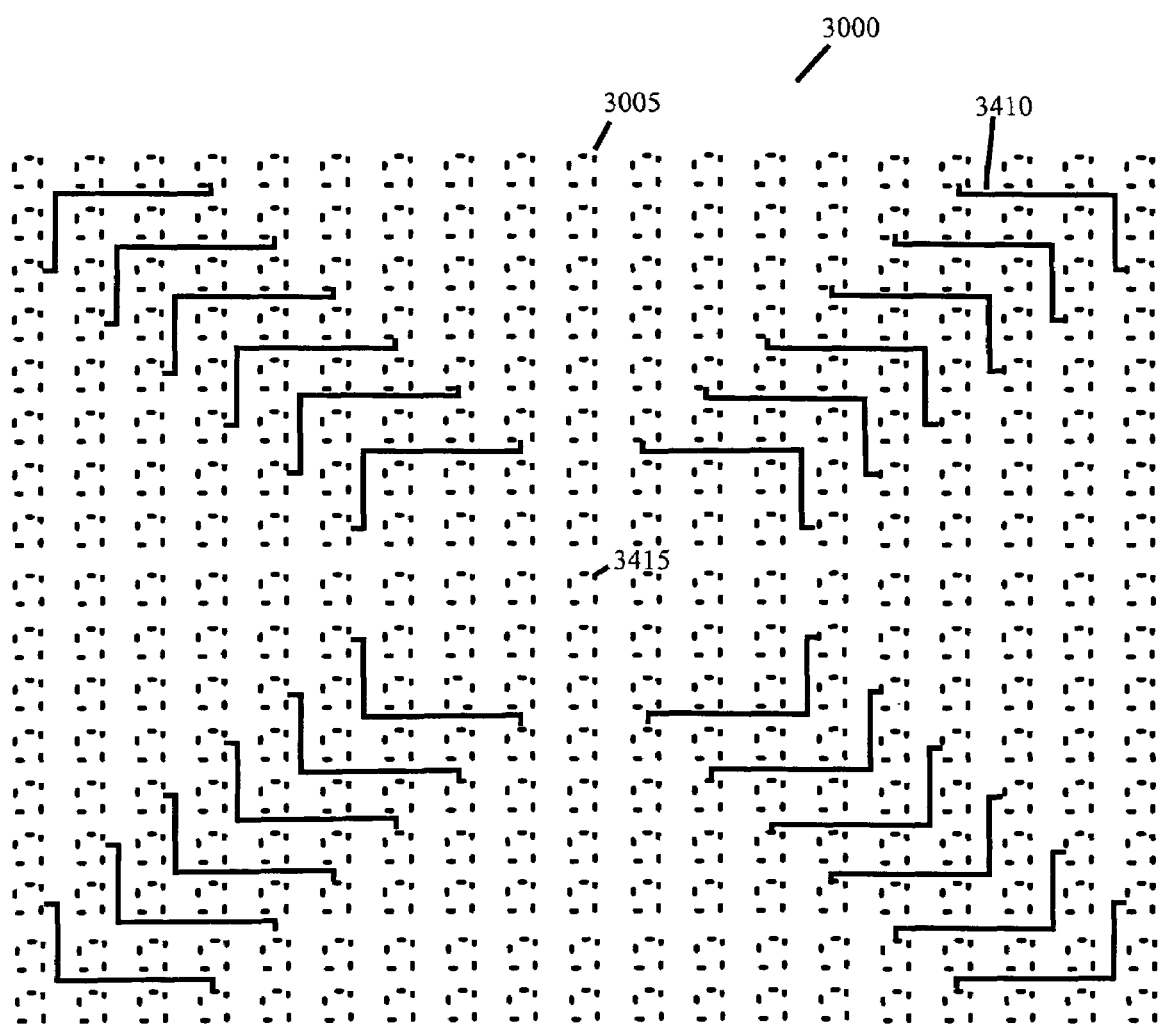

Some embodiments define multiple sets of built-in turns that have multiple sets of symmetrical relationships with each other. For instance, in addition to the four sets of symmetrically arranged turns 3010 of FIG. 30, some embodiments define another set of turns that are symmetrical to each other and perhaps to the turns 3010. For the circuit arrangement 3000, FIG. 34 illustrates another set of symmetrically arranged turns 3410. Each of the turns 3410 connects two circuits 3005 in the circuit arrangement that are separated by three columns and two rows.

Like each turn 3010, each turn 3410 can be established by (1) a set of wire segments that traverse through a set of the VPGA's wiring layers, (2) a set of vias when two or more wiring layers are involved, and (3) possibly one or more buffer circuits. Like the turns 3010, the turns 3410 can also be categorized into four sub-sets of turns that are laid out horizontally and/or vertically symmetrically in the circuit arrangement an origin 3415 in the circuit arrangement. In addition, the turns 3410 are symmetrically related to the turns 3010 as they are rotated versions of the turns 3010.

Figure 35:
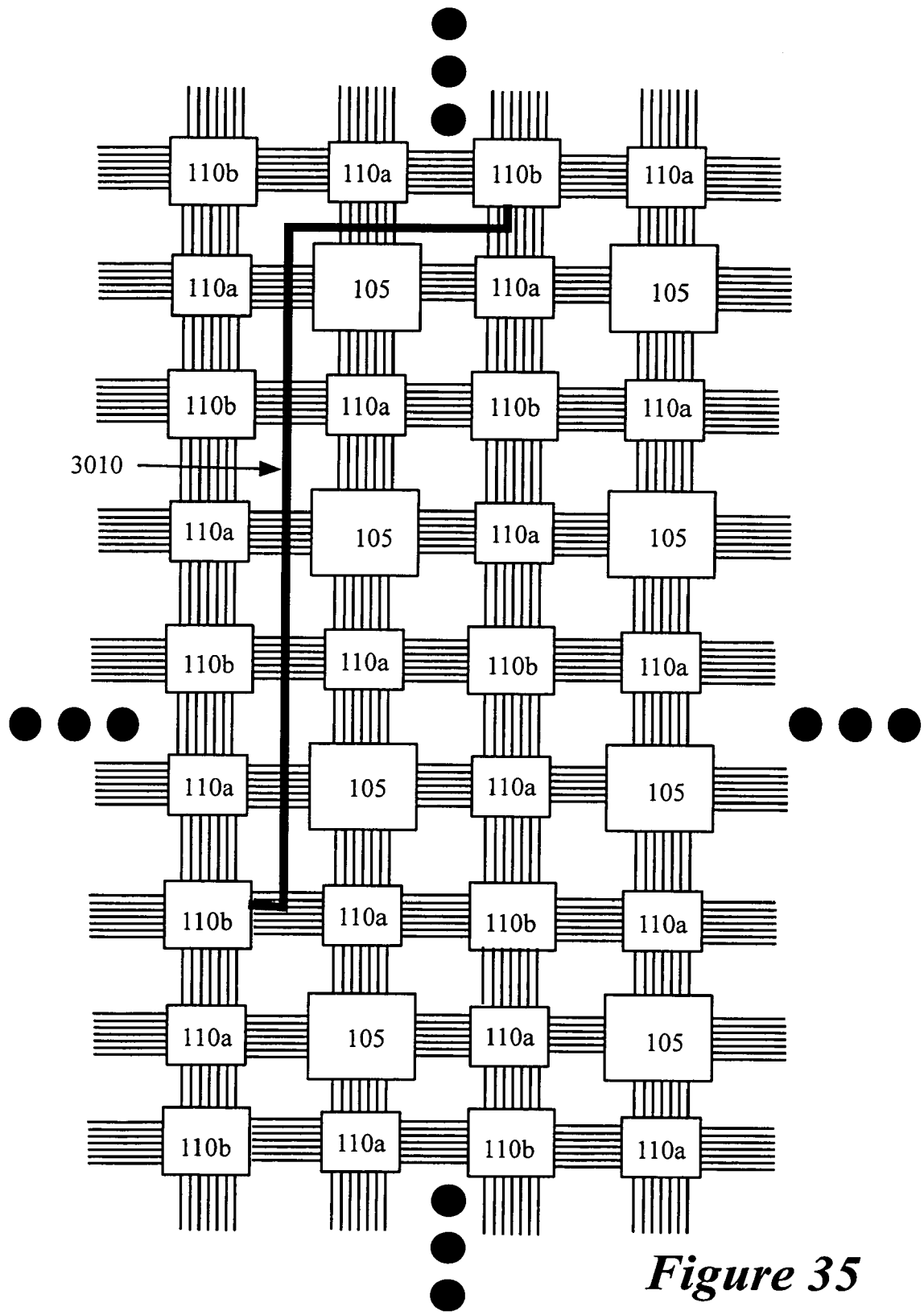
FIG. 35 illustrates an example of a built-in turn in a traditional island style architecture.

As mentioned above, the configurable circuits 3005 are all the same type of circuits in some embodiments. For instance, in some embodiments, all the circuits have the same circuit structure (i.e., the same circuit elements) and perhaps the same internal wiring. One example of such circuits would be switch boxes in a traditional island style architecture. FIG. 35 illustrates an example of a built-in turn 3010 in this architecture.

Although several sets of built-in turns were described above by reference to FIGS. 30-35, one of ordinary skill will realize that other embodiments might use numerous other styles of built-in turns, as well as numerous other architectural layouts of such turns. For instance, the configurable circuit arrangement 3000 does not have the direct connections between circuits 3115, 3120, 3125, and 3130, and/or between circuits 3120, 3135, 3140, and 3145 in some embodiments.

Figure 36:
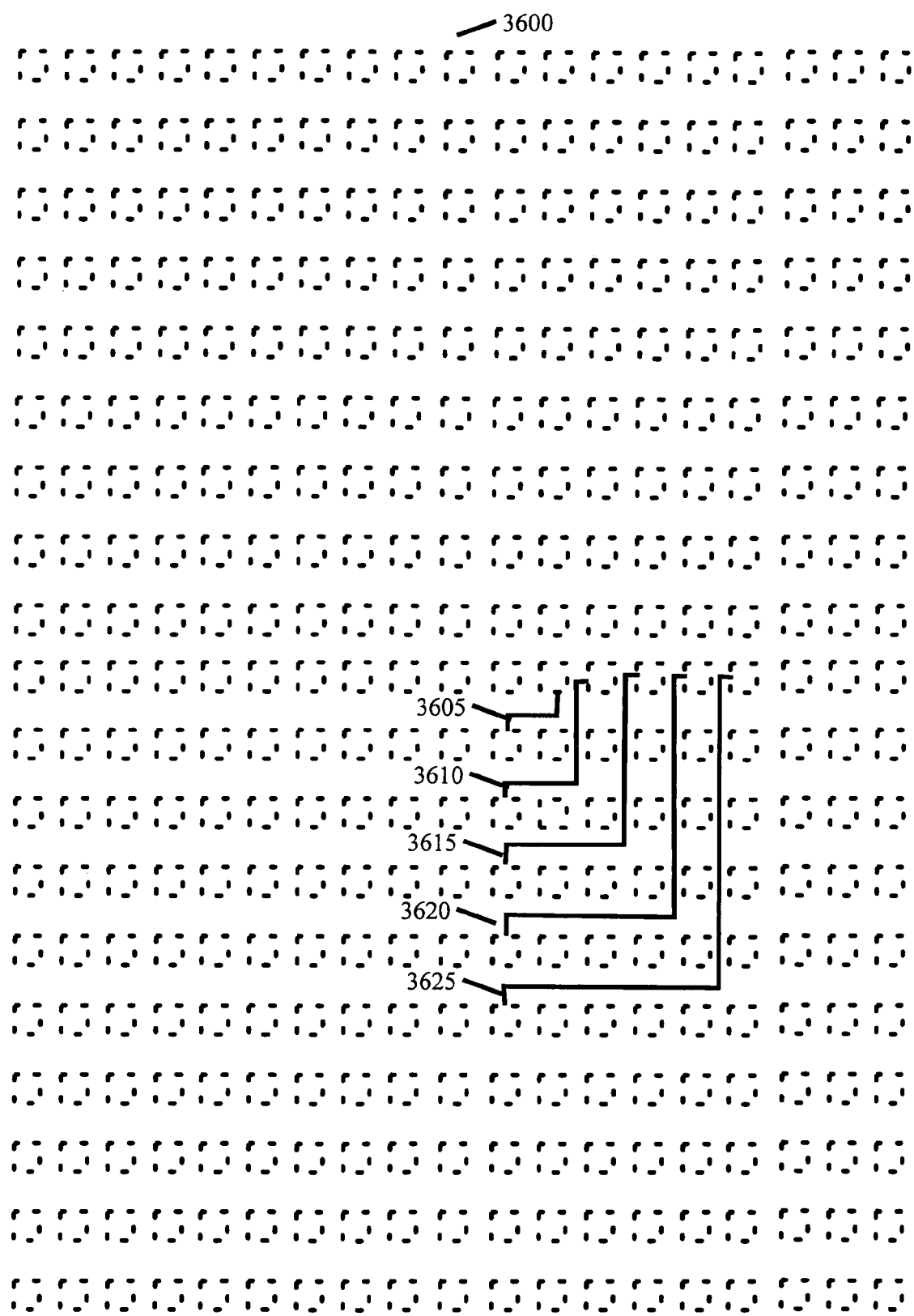
FIG. 36 illustrates a configurable circuit arrangement with a nested set of built-in turns.
Figure 37:
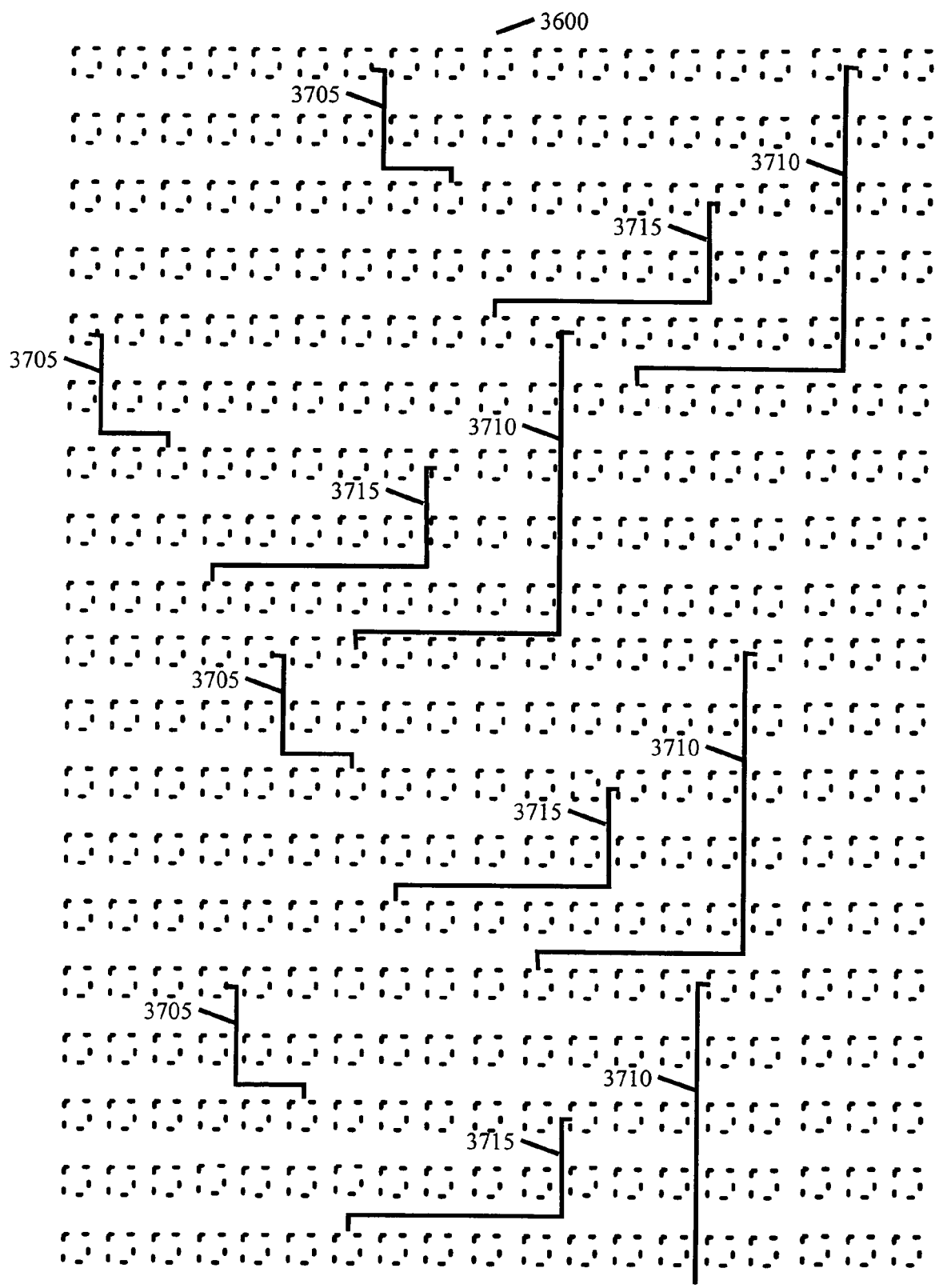
FIG. 37 illustrates a configurable circuit arrangement that has a set of asymmetrical built-in turns that are repeated throughout a portion or the entire circuit arrangement.

Also, FIG. 36 illustrates a configurable circuit arrangement 3600 with a nested set of built-in turns. This set of turns includes five turns 3605, 3610, 3615, 3620, and 3625 that connect five pairs of circuits. FIG. 37 illustrates a configurable circuit arrangement 3700 that has a set of asymmetrical built-in turns that are repeated throughout a portion or the entire circuit arrangement. This asymmetrical set includes three turns 3705, 3710, and 3715.

Like the turns illustrated in FIGS. 30-34, the turns illustrated in FIGS. 36 and 37 can defined by (1) a set of wire segments that traverse through a set of the VPGA's wiring layers, (2) a set of vias when two or more wiring layers are involved, and (3) possibly a set of buffer circuits. For instance, in some embodiments, the turns in FIGS. 36 and 37 are on the same wiring layer (e.g., layer 4). In these embodiments, no built-in turn requires a via to connect the turn's wire segments to each other. (The turns, however, might still require vias to connect to the input and output terminals of circuits in the circuit arrangement.) Alternatively, in some embodiments, different wire segments of the built-in turns are on different wiring layers. Also, as mentioned above, some embodiments use a combination of symmetrical, asymmetrical, and/or nested turns.

VII. Offset Bit Lines in Via Programmable Gate Array

As mentioned above, some embodiments of the invention are implemented in VPGA's, i.e., in configurable IC's that have via programmed (VP) configurable circuits. A VP configured circuit (e.g., VP configured logic or interconnect circuit) receives its respective configuration data from configuration bit lines instead of local storage elements. The VP configured circuit connects to the appropriate bit lines through vias, which are programmably defined to configure the configurable circuit to perform a desired operation (e.g., functions, connections). The VPGA's of some embodiments have built-in turns and/or long offset connections between non-neighboring, non-aligned configurable circuits. Also, the connection schemes of the VPGA's of some embodiments are defined through an optimization process, such as the one discussed in Section V.

In addition to these features, or instead of these features, the VPGA's of some embodiments have configuration bit lines that are not straight (e.g., offset bit lines). These bit lines may be on different layers than the wiring that connect the logic and interconnect circuits. In some embodiments, these offset bit lines are used in conjunction with direct connections between offset circuits, which was previously described.

Figure 38:
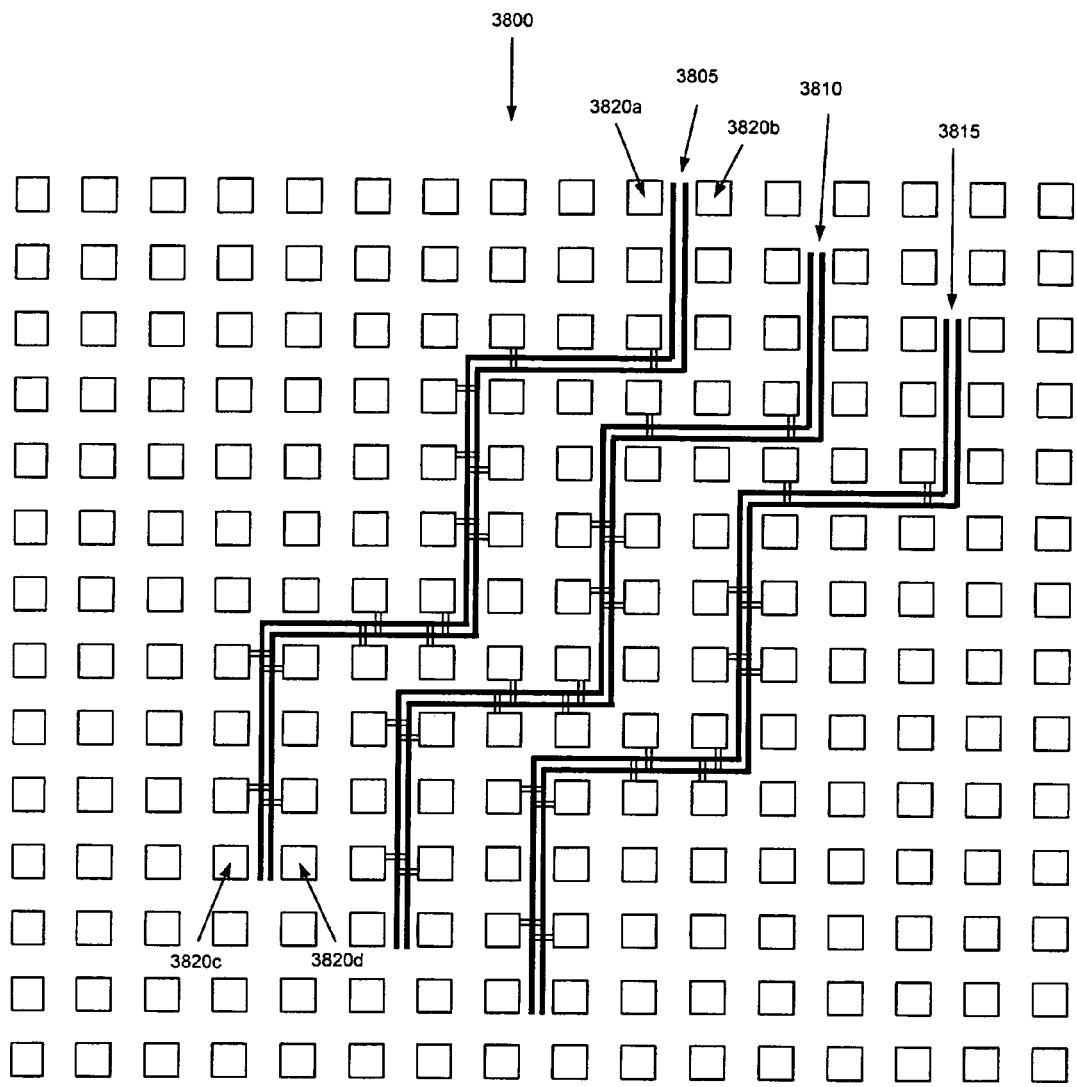
FIG. 38 illustrates a circuit arrangement of configurable circuits with offset bit lines.

FIG. 38 illustrates a circuit arrangement 3800 of a VPGA that implements offset bit lines with configurable circuits. Some or all of the circuits in the circuit arrangement 3800 are VP configured circuits or include one or more VP configured circuit. As shown in this figure, the circuit arrangement of configurable circuits 3800 includes three sets of nested bit lines 3805, 3810 and 3815. Each set of bit line includes a bit line for specifying a first value (e.g., 0) and a bit line for specifying a second value (e.g., 1). As further shown in this figure, each set of bit lines topologically traverses the circuit arrangement of circuits 3800 along several columns and rows of configurable circuits. That is, each set of bit lines includes bit line segments that vertically traverse several rows of circuits and bits line segments that horizontally traverse several columns of circuits.

As shown in FIG. 38, starting between configurable circuits 3820a and 3820b, the set of bit lines 3805 (1) vertically traverses down three rows of configurable circuits, (2) horizontally traverses, in a left direction, three rows of configurable circuits, (3) vertically traverses down four rows of configurable circuits, (4) horizontally traverses, in a left direction, three rows of configurable circuits, and (5) vertically traverses down four rows of configurable circuits to end between configurable circuits 3820c and 3820d. The set of bit lines 3810 and 3815 traverse a similar path, however, as shown in FIG. 38, each set of bit lines 3810 and 3815 start and end between different configurable circuits.

Figure 39:
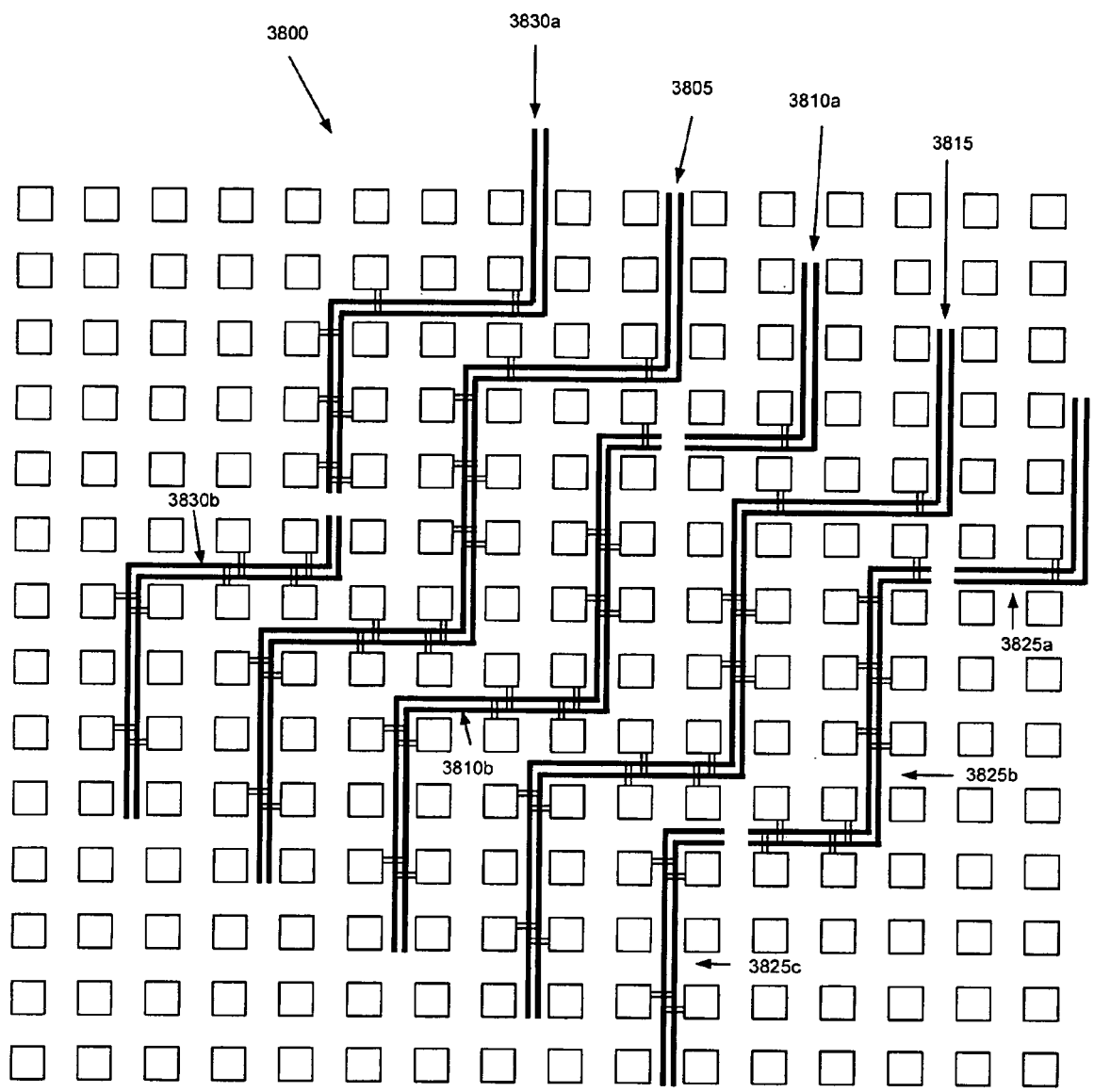
FIG. 39 illustrates a circuit arrangement of configurable circuits with offset bit lines that include disjoint bit line segments.

FIG. 38 illustrates a set of bit lines that includes continuously defined bit lines. However, some embodiments may use one or more sets of bit lines that include disjointed bit lines. Disjoint bit lines are particularly advantageous because they have reduced capacitive load. FIG. 39 illustrates a circuit arrangement of configurable circuits that includes such disjointed bit lines. Some or all of the circuits in the circuit arrangement are VP configured circuits or include one or more VP configured circuit. As shown in this figure, the set of bits lines 3810, 3825 and 3825 include bit lines that are disjointed. Specifically, FIG. 39 illustrates the set of bit lines 3810 that includes two disjoint bit line segments 3810a and 3810b. Similarly, the set of bit lines 3830 includes two disjoint bit line segments 3830a and 3830b. In some embodiments, the set of bit lines may include more than two disjoint bit line segments, such as the set of bit lines 3825, which includes three disjoint bit lines segments 3825a, 3825b and 3825c. Although FIGS. 38 and 39 show bits lines that are nested, some or all of the bit lines may not be nested, in some embodiments.

Figure 40:
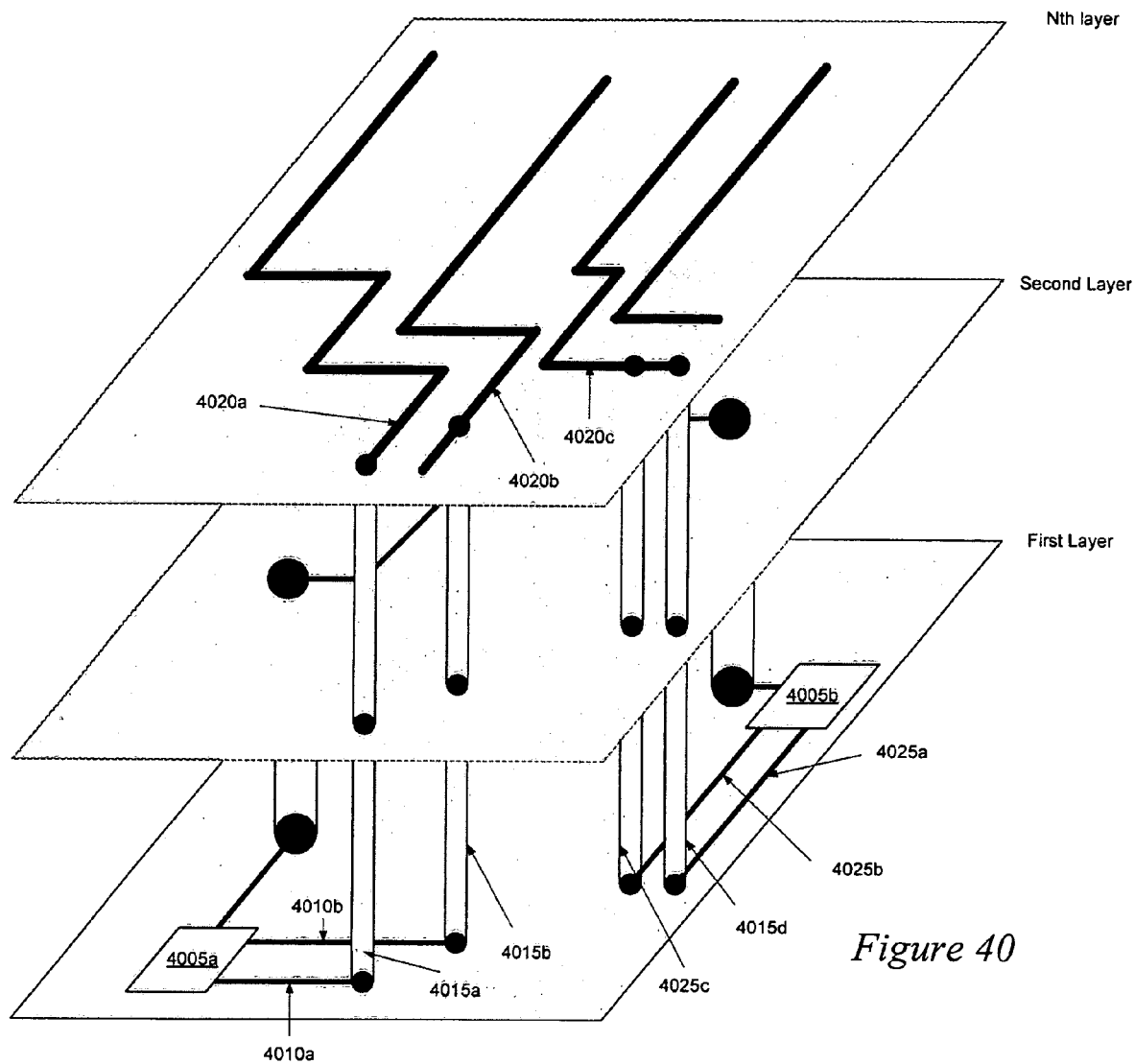
FIG. 40 illustrates a perspective view of a set of offset bit lines used with configurable circuits.

FIG. 40 illustrates a perspective view of how offset bit lines may be implemented with configurable circuits. Specifically, FIG. 40 illustrates a similar circuit configuration as shown in FIG. 19A, except that bit lines provide the configuration data to the configurable circuits instead of storage cells. Some or all of the circuits in the circuit arrangement are VP configured circuits or include one or more VP configured circuit. As shown in FIG. 40, the configurable circuit 4005a includes two configuration terminals 4010a and 4010b. The configuration terminal 4010a is connected to the bit line 4020a through via 4015a. Similarly, the configuration terminal 4010b is connected to the bit line 4020b through via 4015b. FIG. 40 further includes a configurable circuit 4005b that includes two configuration terminals 4025a and 4025b. Each of these two configuration terminals are connected to the bit line 4020c through vias 4015c and 4015d respectively.

Figure 41:
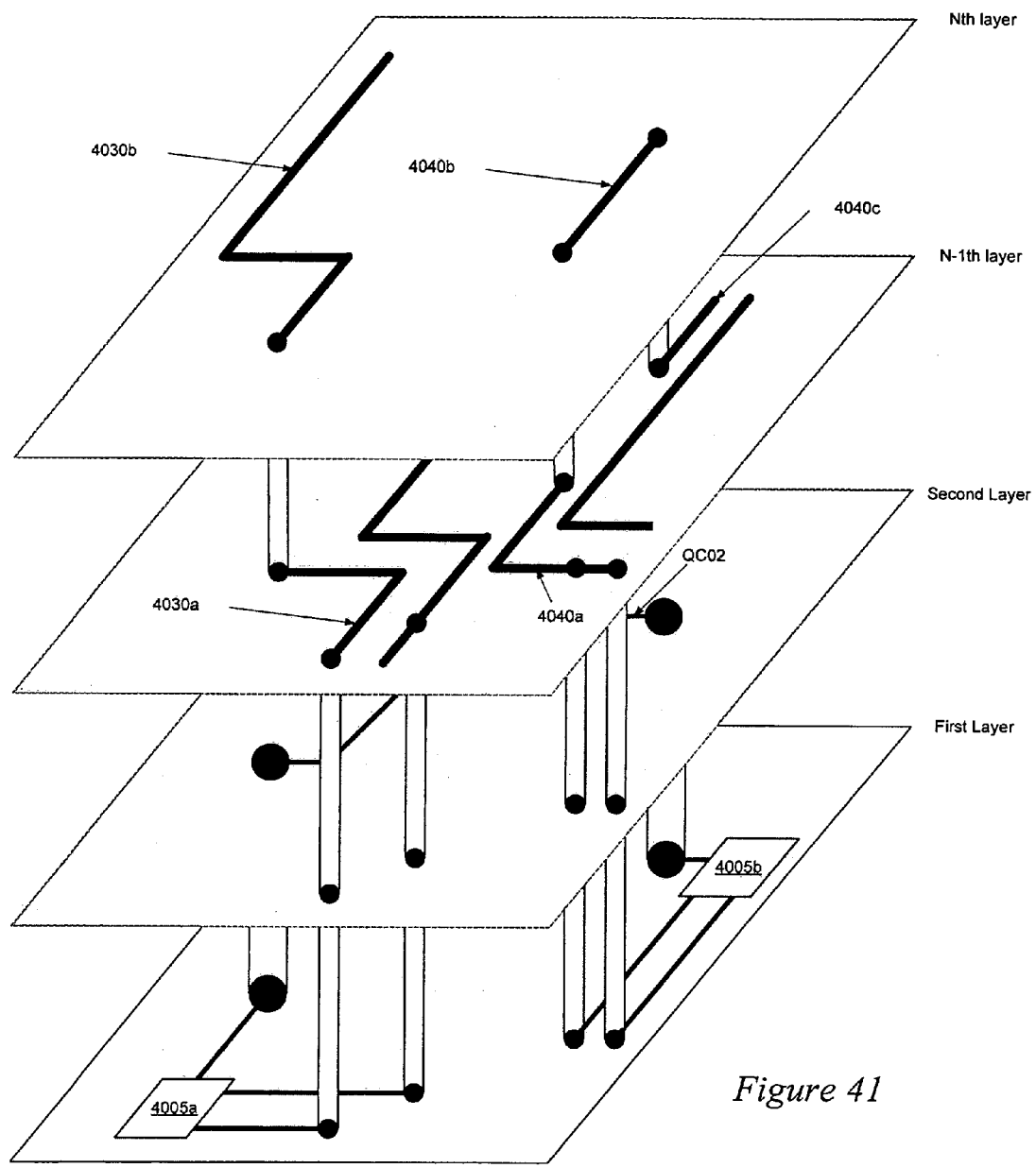
FIG. 41 illustrates a perspective view of another set of offset bit lines used with configurable circuits.

In some embodiments, the bit lines may be on several layers of the VPGA. FIG. 41 illustrates such instances where bit lines are on different layers. Specifically, FIG. 41 is similar to FIG. 40, except that some bit lines traverse two layers. As shown in this figure, the bit line 4030 includes two bit line segments 4030a and 4030b. The bit line segment 4030a is on the N$-1^{th}$ layer while the bit line segment 4030b is on the N$^{th}$ layer. FIG. 41 also illustrates a bit line 4040 that includes three bit line segments 4040a, 4040b and 4040c. As shown in this figure, the bit line segments 4040a and 4040c are on the N$-1^{th}$ layer while the bit line segment 4040b is on the N$^{th}$ layer.

Figure 42:
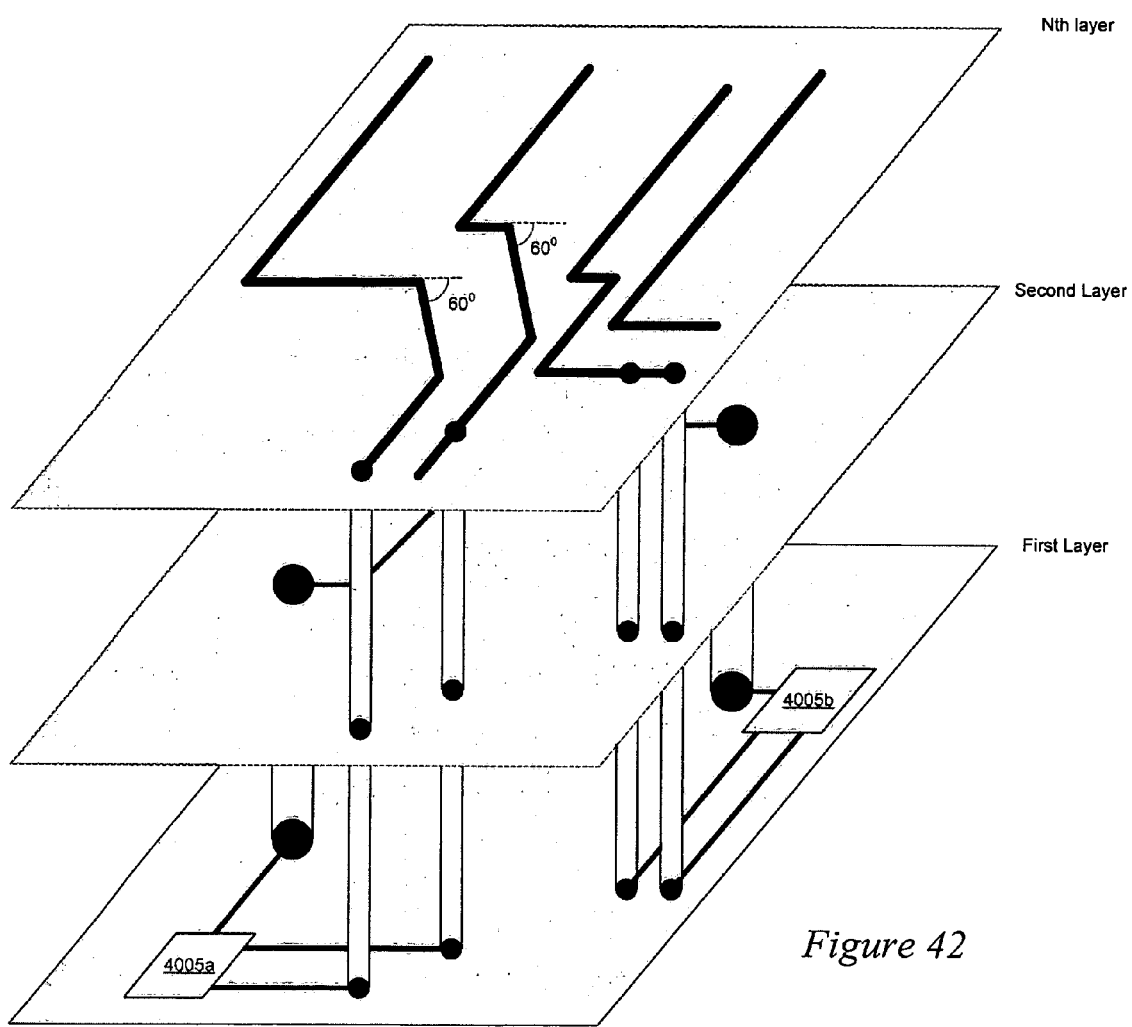
FIG. 42 illustrates a perspective view of a set of offset bit lines that include diagonal bit line segments.

In some embodiments, these bit lines may be implemented by using diagonal bit line segments on one or more layers of a VPGA, as shown in FIG. 42. Specifically, this figure illustrates 60° diagonal bit line segments being implemented in conjunction with vertical and horizontal bit lines segments. Although, 60° diagonal bit line segments are shown, a person of ordinary skill in the art will realize that bit line segments may use other types of diagonal lines that are known in the art. Moreover, different embodiments may use different circuit arrangements. In some embodiments, the diagonal bit lines are occasionally or systematically used for some or all of the bit lines.

While the bit lines are shown implemented on two wiring layers of the VPGA, a person skilled in the art will realize that the wiring model for the bit lines may be implemented on more than two layers. Furthermore, some embodiments might use different bit line wiring models, such as a Euclidean ("all-angle") model, a Manhattan model, an octilinear model, a hexalinear model, or any combination thereof.

VIII. Configurable IC and System

Figure 43:
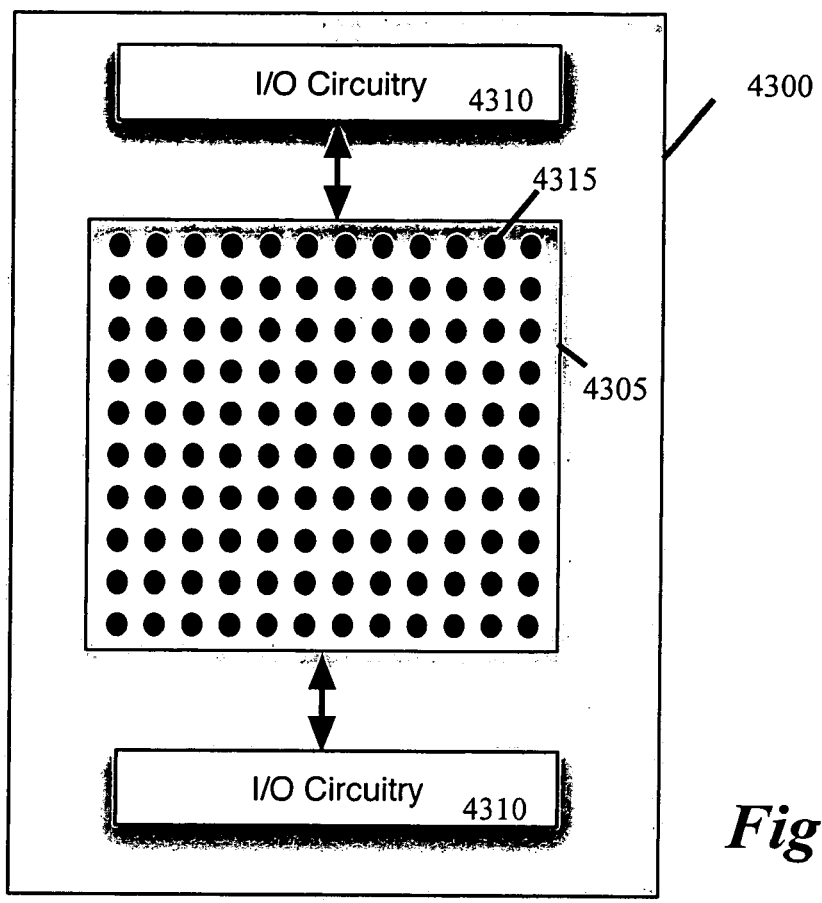
FIG. 43 illustrates a configurable IC of some embodiments of the invention.

FIG. 43 illustrates a portion of a VPGA 4300 of some embodiments of the invention. As shown in this figure, this VPGA has a configurable circuit arrangement 4305 and I/O circuitry 4310. The circuit arrangement 4305 can be any of the invention's configurable circuit arrangements that were described above. The I/O circuitry 4310 is responsible for routing data between the configurable circuits 4315 of the circuit arrangement 4305 and circuits outside of the circuit arrangement (i.e., circuits outside of the IC, or within the IC but outside of the circuit arrangement 4305). As further described below, such data includes data that needs to be processed or passed along by the configurable circuits.

Figure 44:
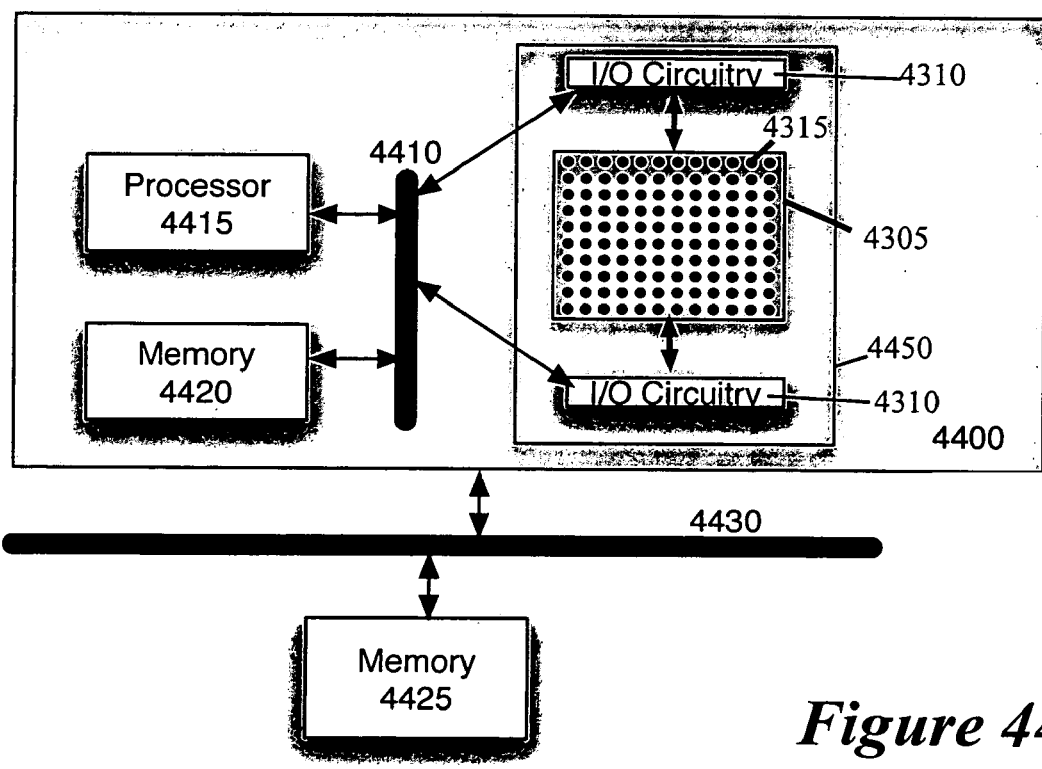
FIG. 44 illustrates an alternative configurable IC of some embodiments of the invention.

A VPGA of the invention can also include circuits other than the configurable circuit arrangement and I/O circuitry. For instance, FIG. 44 illustrates one such VPGA 4400. This VPGA has a configurable block 4450, which includes a configurable circuit arrangement 4305 and I/O circuitry 4310 for this circuit arrangement. It also includes a processor 4415 outside of the circuit arrangement, a memory 4420, and a bus 4410, which conceptually represents all conductive paths between the processor 4415, memory 4420, and the configurable block 4450. As shown in FIG. 44, the VPGA 4400 couples to a bus 4430, which communicatively couples the VPGA to other circuits, such as an off-chip memory 4425. Bus 4430 conceptually represents all conductive paths between the components of the VPGA 4400.

This processor 4415 can read and write instructions and/or data from an on-chip memory 4420 or an offchip memory 4425. The processor 4415 can also communicate with the configurable block 4450 through memory 4420 and/or 4425 through buses 4410 and/or 4430. Similarly, the configurable block can retrieve data from and supply data to memories 4420 and 4425 through buses 4410 and 4430.

Figure 45:
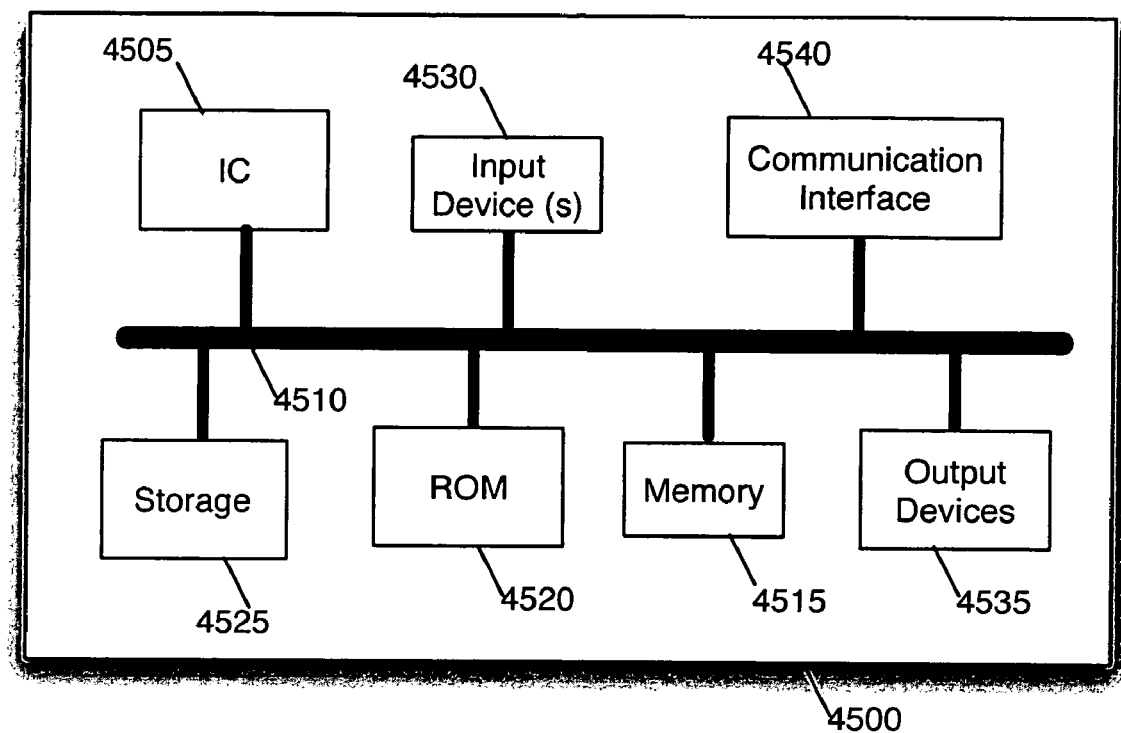
FIG. 45 conceptually illustrates a more detailed example of a computing system that has a configurable IC according to some embodiments of the invention.

FIG. 45 conceptually illustrates a more detailed example of a computing system 4500 that has a VPGA 4505, which includes one of the invention's configurable circuit arrangements that were described above. The system 4500 can be a stand-alone computing or communication device, or it can be part of another electronic device. As shown in FIG. 45, the system 4500 not only includes the VPGA 4505, but also includes a bus 4510, a system memory 4515, a read-only memory 4520, a storage device 4525, input devices 4530, output devices 4535, and communication interface 4540.

The bus 4510 collectively represents all system, peripheral, and chipset interconnects (including bus and non-bus interconnect structures) that communicatively connect the numerous internal devices of the system 4500. For instance, the bus 4510 communicatively connects the VPGA 4510 with the read-only memory 4520, the system memory 4515, and the permanent storage device 4525.

From these various memory units, the VPGA 4505 receives data for processing. When the VPGA 4505 has a processor, the VPGA also retrieves from the various memory units instructions to execute. The read-only-memory (ROM) 4520 stores static data and instructions that are needed by the VPGA 4510 and other modules of the system 4500. The storage device 4525, on the other hand, is read-and-write memory device. This device is a non-volatile memory unit that stores instruction and/or data even when the system 4500 is off. Like the storage device 4525, the system memory 4515 is a read-and-write memory device. However, unlike storage device 4525, the system memory is a volatile read-and-write memory, such as a random access memory. The system memory stores some of the instructions and/or data that the VPGA needs at runtime.

The bus 4510 also connects to the input and output devices 4530 and 4535. The input devices enable the user to enter information into the system 4500. The input devices 4530 can include touch-sensitive screens, keys, buttons, keyboards, cursor-controllers, microphone, etc. The output devices 4535 display the output of the system 4500.

Finally, as shown in FIG. 45, bus 4510 also couples system 4500 to other devices through a communication interface 4540. Examples of the communication interface include network adapters that connect to a network of computers, or wired or wireless transceivers for communicating with other devices. One of ordinary skill in the art would appreciate that any other system configuration may also be used in conjunction with the invention, and these system configurations might have fewer or additional components.

While the invention has been described with reference to numerous specific details, one of ordinary skill in the art will recognize that the invention can be embodied in other specific forms without departing from the spirit of the invention. Thus, one of ordinary skill in the art would understand that the invention is not be limited by the foregoing illustrative details, but rather is not be defined by the appended claims.

What is claimed is:

1. A via programmable gate array ("VPGA") comprising:
   a set of at least fifty configurable circuits arranged in a circuit arrangement having a plurality of rows and a plurality of columns, wherein a plurality of the circuits are via programmable ("VP") configured circuits;
   a plurality of offset bit lines, wherein each particular offset bit line traverses along more than one column or row in the circuit arrangement, wherein the plurality of offset bit lines provides configuration values to at least one VP configured circuit.

2. The VPGA of claim 1, wherein the configuration values configure the at least one VP configured circuit.

3. The VPGA of claim 2, wherein a first set of bit lines are on a first layer of the VPGA.

4. The VPGA of claim 3, wherein a second set of bit lines are on the second layer of the VPGA, wherein the first and second set of bit lines provide different configuration values.

5. The VPGA of claim 1, wherein at least one bit line provides a configuration value of 0.

6. The VPGA of claim 1, wherein at least one bit line provides a configuration value of 1.

7. The VPGA of claim 1, wherein a set of plurality of offset bit lines are disjoint bit lines.

8. The VPGA of claim 1, wherein the plurality of offset bit lines traverses along two layers of the IC.

9. The VPGA of claim 1, wherein each configurable circuit is a VP configured circuit for configurable performing a set of operations.

10. The VPGA of claim 1, wherein the configurable circuits in the circuit arrangement have the same set of circuit elements and the same wiring between the circuit elements.

11. The VPGA of claim 1, wherein each configurable circuit is a VP configured interconnect circuit.

12. The VPGA of claim 11, wherein each configurable circuit is a VP configured logic circuit.

13. The VPGA of claim 1, wherein a set of the bit lines are long offset bit lines, wherein long offset bit lines traverse along at least one column and along at least two rows of the circuit arrangement.

14. The VPGA of claim 1, wherein a set of the bit lines are long offset bit lines, wherein long offset bit lines traverse along at least one row and along at least two columns of the circuit arrangement.

* * * * *

UNITED STATES PATENT AND TRADEMARK OFFICE
CERTIFICATE OF CORRECTION

| | |
|---|---|
| PATENT NO. | : 7,262,633 B1 |
| APPLICATION NO. | : 11/271080 |
| DATED | : August 28, 2007 |
| INVENTOR(S) | : Herman Schmit et al. |

It is certified that error appears in the above-identified patent and that said Letters Patent is hereby corrected as shown below:

Title Page, Item (57)

Abstract

Lines 1-13, (Abstract) reads "Some embodiments provide a via programmable gate array ("VPGA") with several configurable circuits arranged in a configurable circuit arrangement. At least some of the configurable circuits are via programmable ("VP") configured circuits. In some embodiments, the configurable circuit arrangement is a configurable circuit arrangement that includes numerous (e.g., 50, 100, etc.) configurable circuits that are arranged in several rows and columns. This circuit arrangement also includes several bit lines, where at least one the bit line provides a configuration value to at least one configurable circuit. In some embodiments, at least some bit lines transverse along more than one column or row in the circuit arrangement."

should read (correction of abstract) -- Some embodiments provide a via programmable gate array ("VPGA") with several configurable circuits arranged in a configurable circuit arrangement. At least some of the configurable circuits are via programmable ("VP") configured circuits. In some embodiments, the configurable circuit arrangement is a configurable circuit arrangement that includes numerous (e.g., 50, 100, etc.) configurable circuits that are arranged in several rows and columns. This circuit arrangement also includes several bit lines, where at least one bit line provides a configuration value to at least one configurable circuit. In some embodiments, at least some bit lines traverse along more than one column or row in the circuit arrangement. --

UNITED STATES PATENT AND TRADEMARK OFFICE
CERTIFICATE OF CORRECTION

| | |
|---|---|
| PATENT NO. | : 7,262,633 B1 |
| APPLICATION NO. | : 11/271080 |
| DATED | : August 28, 2007 |
| INVENTOR(S) | : Herman Schmit et al. |

It is certified that error appears in the above-identified patent and that said Letters Patent is hereby corrected as shown below:

Column 28

Lines 39-41 (claim) reads "9. The VPGA of claim 1, wherein each configurable circuit is a VP configured circuit for configurable performing a set of operations."

should read (correction of claim) -- The VPGA of claim 1, wherein each configurable circuit is a VP configured circuit for configurably performing a set of operations. --

Signed and Sealed this

Fifteenth Day of July, 2008

JON W. DUDAS
*Director of the United States Patent and Trademark Office*